United States Patent
Kang et al.

(10) Patent No.: US 12,365,095 B2
(45) Date of Patent: Jul. 22, 2025

(54) LOADER DEVICE AND SUBSTRATE TRANSPORT SYSTEM

(71) Applicant: SAMSUNG ELECTRONICS CO., LTD., Suwon-si (KR)

(72) Inventors: Hyun Jae Kang, Suwon-si (KR); Young Wook Kim, Seoul (KR); Seung Gyu Kang, Hwaseong-si (KR); Chul-Jun Park, Seoul (KR); Yong-Jun Ahn, Suwon-si (KR); Sang Kyung Lee, Hwaseong-si (KR); Hyun Woo Lee, Hwaseong-si (KR); Jeong Hun Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 396 days.

(21) Appl. No.: 18/058,839

(22) Filed: Nov. 25, 2022

(65) Prior Publication Data

US 2023/0256617 A1    Aug. 17, 2023

(30) Foreign Application Priority Data

Feb. 14, 2022    (KR) .................. 10-2022-0018683

(51) Int. Cl.
  *B25J 11/00*    (2006.01)
  *B25J 9/16*    (2006.01)
  (Continued)

(52) U.S. Cl.
  CPC ......... *B25J 11/0095* (2013.01); *B25J 9/1697* (2013.01); *H01L 21/67259* (2013.01);
  (Continued)

(58) Field of Classification Search
  CPC ................ B25J 11/0095; B25J 9/1697; H01L 21/67259; H01L 21/67724; H01L 21/6773;
  (Continued)

(56) References Cited

U.S. PATENT DOCUMENTS 6,779,760 B2 *   8/2004   Chang ............... H01L 21/67736
                                               340/673
9,688,472 B1    6/2017   Stubbs et al.
  (Continued)

FOREIGN PATENT DOCUMENTS

KR    10-2004-0021985    3/2004
KR    10-2006-0083340    7/2006
  (Continued)

OTHER PUBLICATIONS

KR 20110033882 English translation (Year: 2011).*
KR 20170026816 English translation (Year: 2017).*

*Primary Examiner* — Thomas E Worden
*Assistant Examiner* — Christopher Scott
(74) *Attorney, Agent, or Firm* — MORGAN, LEWIS & BOCKIUS LLP

(57) ABSTRACT

A loader device includes a frame, a first opening formed in a first side surface of the frame, a second opening formed on a second side surface of the frame, a cavity that connects the first opening and the second opening, a transport unit in the cavity, a first sensor that senses a presence or absence of a first substrate carrier, a second sensor that senses access of a person, and a controller that receives a first sensor signal from the first sensor and receives a second sensor signal from the second sensor. In response to the first sensor signal, the controller controls the transport unit to not transfer a second substrate carrier to the first opening, controls the transport unit to pick up the first substrate carrier from the
(Continued)

first opening, and interrupts operation of the transport unit in response to the second sensor signal.

9 Claims, 24 Drawing Sheets

(51) Int. Cl.
    *H01L 21/67*     (2006.01)
    *H01L 21/677*     (2006.01)
    *H01L 21/68*     (2006.01)

(52) U.S. Cl.
    CPC .... *H01L 21/67724* (2013.01); *H01L 21/6773* (2013.01); *H01L 21/67769* (2013.01); *H01L 21/67775* (2013.01); *H01L 21/68* (2013.01)

(58) Field of Classification Search
    CPC ......... H01L 21/67769; H01L 21/67775; H01L 21/68
    See application file for complete search history.

(56) References Cited

U.S. PATENT DOCUMENTS

| | | | | |
|---|---|---|---|---|
| 2012/0263562 | A1* | 10/2012 | Mizokawa | H01L 21/67736 |
| | | | | 414/618 |
| 2013/0051966 | A1* | 2/2013 | Kim | H01L 21/67769 |
| | | | | 414/751.1 |
| 2014/0202921 | A1* | 7/2014 | Babbs | H01L 21/67376 |
| | | | | 206/710 |
| 2020/0168488 | A1* | 5/2020 | Sunugatov | H01L 21/67393 |
| 2022/0293445 | A1* | 9/2022 | Uenoyama | H01L 21/67778 |

FOREIGN PATENT DOCUMENTS

| | | | |
|---|---|---|---|
| KR | 10-2007-0000030 | | 1/2007 |
| KR | 10-2007-0002616 | | 1/2007 |
| KR | 10-2008-0049221 | | 6/2008 |
| KR | 10-2010-0063174 | | 6/2010 |
| KR | 20170026816 A | * | 4/2011 |
| KR | 20110033882 A | * | 3/2017 |

* cited by examiner

LOADER DEVICE AND SUBSTRATE TRANSPORT SYSTEM

CROSS-REFERENCE TO RELATED APPLICATION

This application claims priority under 35 U.S.C. 119 from Korean Patent Application No. 10-2022-0018683, filed on Feb. 14, 2022 in the Korean Intellectual Property Office, the contents of which are herein incorporated by reference in their entirety.

TECHNICAL FIELD

Embodiments of the present disclosure are directed to a loader device and a substrate transport system.

DISCUSSION OF THE RELATED ART

A production line that manufactures a substrate that includes a semiconductor element uses an automated system to transport and keep the substrate. A carrier that accommodates the substrate is used when transporting and holding the substrate, and a FOUP (Front Open Unified Pod) may be used as a substrate carrier. In a substrate transport system, an apparatus that holds the substrate carrier for a certain period of time and unloads it when performing a next process is called a carrier stocker.

On the other hand, even if the substrate transport system is automated, to the system may manually transport the substrate carrier to the stocker due to an increase in physical quantity, etc. At this time, the substrate carrier is manually transported through a manual port placed adjacent to the stocker. There is a risk of unsafe accidents when an operator manually transports the substrate carrier through the manual port.

SUMMARY

Embodiments of the present disclosure provide a loader device that has increased efficiency and safety.

Embodiments of the present disclosure also provide a substrate transport system that has improved efficiency and safety.

According to some embodiments of the present inventive concept, there is provided a loader device that includes a frame, a first opening formed in a first side surface of the frame, a second opening formed in a second side surface of the frame that is opposite to the first side surface, a cavity connected to the first opening and the second opening and that penetrates the frame, a transport unit placed in the cavity and that transfers a substrate carrier between the first opening and the second opening, a first sensor placed on the first side surface and that senses a presence or absence of a first substrate carrier adjacent to the first opening, a second sensor placed on the second side surface and that senses access of a person in a sensing region around the frame, and a controller that receives a first sensor signal from the first sensor and receives a second sensor signal from the second sensor. In response to the first sensor signal that indicates the presence of the first substrate carrier adjacent to the first opening, the controller controls the transport unit to not transfer a second substrate carrier different from the first substrate carrier to the first opening in a first mode, the controller controls the transport unit to pick up the first substrate carrier from the first opening in a second mode, and the controller interrupts operation of the transport unit in response to the second sensor signal that indicates access of the person.

According to some embodiments of the present inventive concept, there is provided a substrate transport system that includes a stocker device into which a substrate carrier that accommodates a substrate is loaded, a manual port placed adjacent to one surface of the stocker device and that loads and unloads the substrate carrier to and from the stocker device, a loader device placed opposite to one surface of the manual port and that loads and unloads the substrate carrier to and from the manual port, a transport robot aligned with the loader device and that transports the substrate carrier, and a controller that controls the stocker device, the manual port, the loader device, and the transport robot. The loader device includes a frame, a first opening formed in a first side surface of the frame that faces one surface of the manual port, a second opening formed in a second side surface of the frame that is opposite side to the first side surface and the transport robot, a cavity connected to the first opening and the second opening and that penetrates the frame, a transport unit placed in the cavity and that transfers the substrate carrier between the manual port and the transport robot through the first opening and the second opening, a first sensor placed on the first side surface and that senses a presence or absence of a first substrate carrier on the manual port that is adjacent to the first opening, and a second sensor placed on the second side surface and that measures displacement of the transport robot with respect to the second opening. The transport robot includes a marker that is sensed by the second sensor, the controller receives from the second sensor a second sensor signal that includes information about the displacement of the transport robot, and the controller adjusts the displacement of the transport unit with respect to the transport robot in response to the second sensor signal.

According to some embodiments of the present inventive concept, there is provided a loader device that includes a frame, a first opening formed in a first side surface of the frame, a second opening formed in a second side surface of the frame that is opposite to the first side surface, a cavity that connects the first opening and the second opening and penetrates the frame, a transport unit placed in the cavity and that transfers a substrate carrier between the first opening and the second opening, a first sensor placed on the first side surface and that senses a presence or absence of a first substrate carrier adjacent to the first opening, a second sensor placed on the first side surface and that senses light emitted onto the first side surface, a third sensor placed on the second side surface and that senses access of a person in a sensing region around the frame, a fourth sensor placed on the second side surface and that measures a displacement of a transport robot with respect to the second opening, an access prevention unit placed on the second side surface and that prevents access to the frame, and a controller that receives first to fourth sensor signals from the first to fourth sensors and controls the transport unit. The transport unit includes a traveling shaft that extends parallel to an upper surface of the frame and is placed on an inner upper surface of the cavity, an elevating shaft connected to the traveling shaft and that extends in a direction perpendicular to the upper surface, a rotary shaft connected to the elevating shaft and that rotates in a plane parallel to the upper surface between the first opening and the second opening, a fork shaft fixed to the rotary shaft and that linearly moves parallel to the upper surface, a hand unit connected to the fork shaft and that grips the substrate carrier, a fifth sensor placed in the hand unit and that measures a position of the hand unit with respect to the transport robot, and a sixth sensor placed on a side portion of the rotary shaft and that senses a presence or absence of a second substrate carrier on the transport robot adjacent to the second opening. The controller discriminates a first mode and a second mode based on a second sensor signal received from the second sensor. In response to the first sensor signal that indicates the presence of the first substrate carrier adjacent to the first opening, the controller controls the transport unit to not transfer the second substrate carrier from the second opening to the first opening in the first mode, the controller controls the transport unit to pick up the first substrate carrier from the first opening in the second mode, the controller interrupts the operation of the transport unit in response to the third sensor signal received from the third sensor that indicates access of the person in the sensing region, and the controller adjusts the position of the hand unit of the transport unit in response to the fourth sensor signal received from the fourth sensor that includes a displacement value of the transport robot with respect to the second opening.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

DETAILED DESCRIPTION

Hereinafter, embodiments according to the technical idea of the present disclosure will be described with reference to the accompanying drawings.

Figure 1:
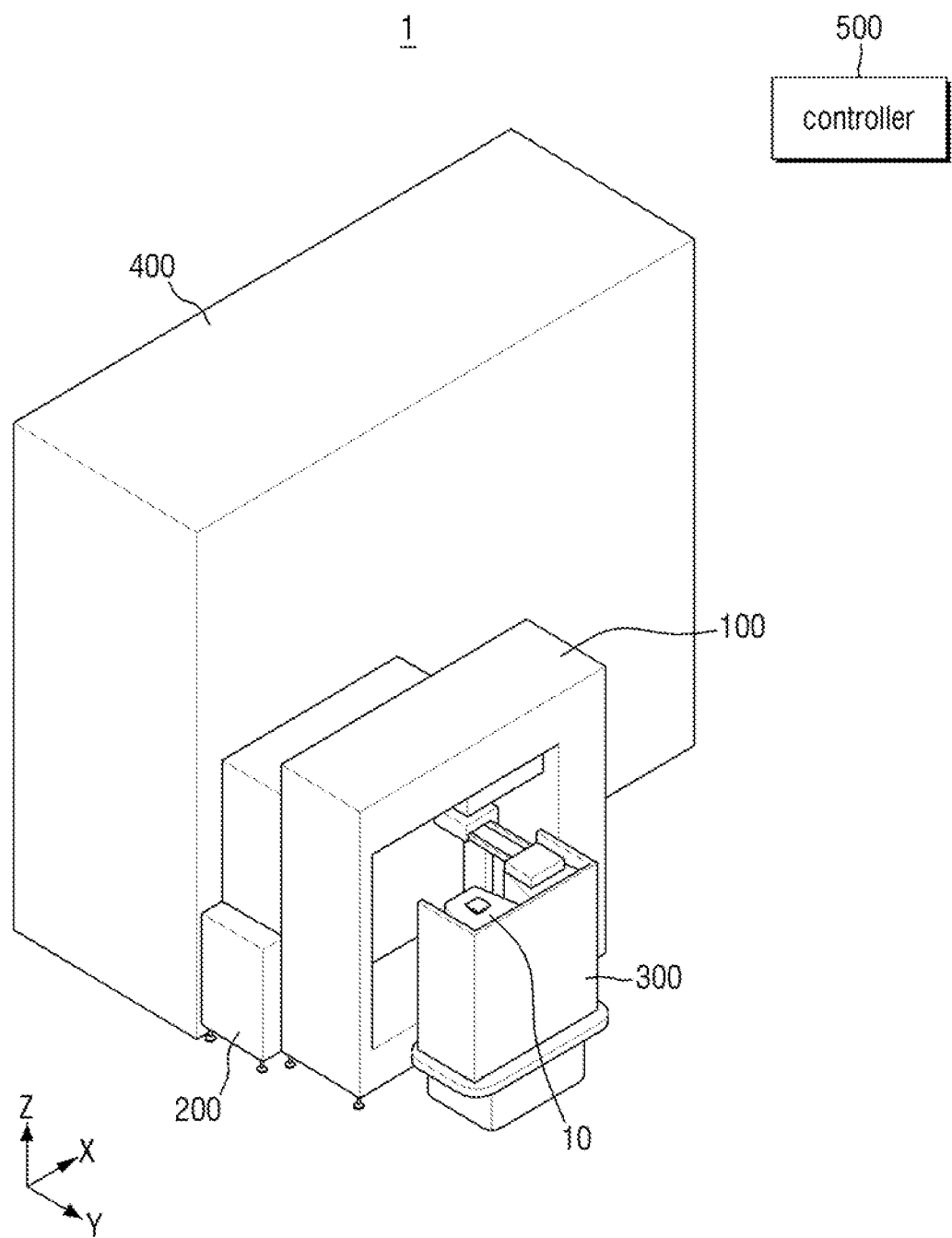
FIG. 1 is a perspective view of a substrate transport system according to some embodiments.
Figure 2:
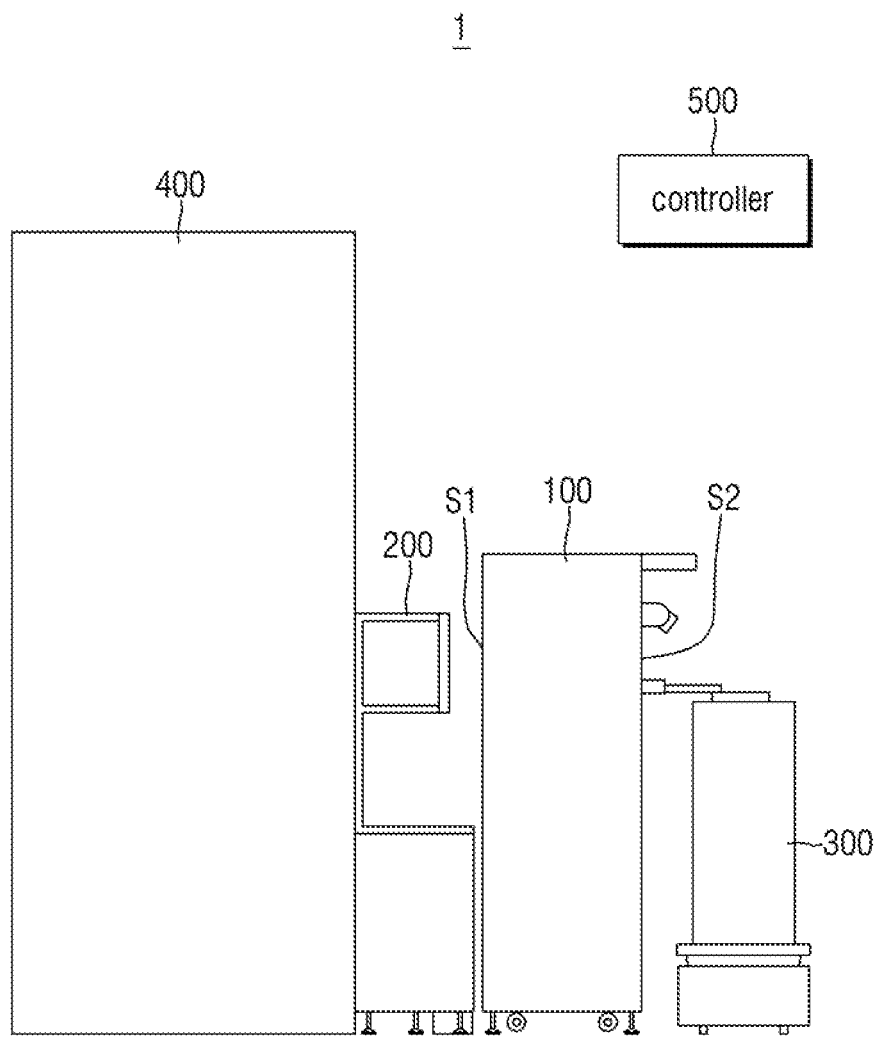
FIG. 2 is a side view of a substrate transport system according to some embodiments.

FIG. 1 is a perspective view of a substrate transport system according to some embodiments. FIG. 2 is a side view of a substrate transport system according to some embodiments.

Referring to FIGS. 1 and 2, in some embodiments, a substrate transport system 1 includes a loader device 100, a manual port 200, a transport robot 300, a stocker device 400, and a controller 500. The substrate transport system 1 transports and holds the substrate carrier 10 in which a substrate is accommodated.

The substrate transport system 1 loads the substrate carrier 10 into the stocker device 400 in a first mode. The substrate transport system 1 loads the substrate carrier 10 into the stocker device 400 and holds the substrate. The substrate transport system 1 unloads the substrate carrier 10 from the stocker device 400 in a second mode. The substrate transport system 1 unloads and transports the substrate carrier 10 held in the stocker device 400.

The substrate carrier 10 has a FOUP (Front Open Unified Pod) structure. For example, the substrate carrier 10 loads and holds a plurality of substrates on the FOUP.

The loader device 100 is placed between the manual port 200 and the transport robot 300. The loader device 100 faces a side surface of the manual port 200. The loader device 100 is placed in front of the side surface of the manual port 200.

According to an embodiment, the loader device 100 is selectively placed adjacent to the manual port 200. For example, the loader device 100 is not fixed at a position to face the side surface of the manual port 200, and can be removed from the front surface of the side surface of the manual port 200. Alternatively, in an embodiment, the loader device 100 is fixed at a position to face the side surface of the manual port 200.

The transport robot 300 provides the loader device 100 with the substrate carrier 10 in the first mode. In the first mode, the loader device 100 provides the substrate carrier 10 received from the transport robot 300 to the manual port 200. For example, when the substrate carrier 10 is loaded onto the stocker device 400, the loader device 100 operates as an interface that transfers the substrate carrier 10 from the transport robot 300 to the manual port 200.

The loader device 100 receives the substrate carrier 10 from the manual port 200 in the second mode. The loader device 100 provides the substrate carrier 10 received from the manual port 200 to the transport robot 300 in the second mode. For example, when the substrate carrier 10 is unloaded from the stocker device 400, the loader device 100 operates as an interface that transfers the substrate carrier 10 from the manual port 200 to the transport robot 300.

The manual port 200 is placed between the loader device 100 and the stocker device 400. The manual port 200 faces the side surface of the stocker device 400. For example, the manual port 200 is placed adjacent to the side surface of the stocker device 400.

The manual port 200 receives the substrate carrier 10 from the loader device 100 in the first mode. The manual port 200 provides the stocker device 400 with the substrate carrier 10 received from the loader device 100 in the first mode. For example, when the substrate carrier 10 is loaded into the stocker device 400, the manual port 200 operates as an interface that transfers the substrate carrier 10 from the loader device 100 to the stocker device 400.

The manual port 200 receives the substrate carrier 10 from the stocker device 400 in the second mode. The manual port 200 provides the loader device 100 with the substrate carrier 10 received from the stocker device 400 in the second mode. For example, when the substrate carrier 10 is unloaded from the stocker device 400, the manual port 200 operates as an interface that transfers the substrate carrier 10 from the stocker device 400 to the loader device 100.

The transport robot 300 conveys the substrate carrier 10. The transport robot 300 transfers the substrate carrier 10 while moving. The transport robot 300 can move since its position is not fixed. The transport robot 300 is temporarily aligned with the loader device 100 that provides and receives the substrate carrier 10 under the control of the controller 500.

The transport robot 300 aligns with the loader device 100. The transport robot 300, when aligned with the loader device 100, provides and receives the substrate carrier 10 to and from the loader device 100.

The transport robot 300 provides the substrate carrier 10 to the loader device 100 in the first mode. For example, when the substrate carrier 10 is to be loaded into the stocker device 400, the transport robot 300 transfers the substrate carrier 10 to the loader device 100. The transport robot 300 receives the substrate carrier 10 from the loader device 100 in the second mode. For example, when the substrate carrier 10 is unloaded from the stocker device 400, the transport robot 300 receives the substrate carrier 10 from the loader device 100.

The stocker device 400 holds the substrate carrier 10. The stocker device 400 holds and stores the substrate carrier 10. The substrate carrier 10 is loaded into the stocker device 400. The stocker device 400 is provided with the substrate carrier 10 through the manual port 200. The stocker device 400 stacks and holds the substrate carriers 10. The stocker device 400 unloads the substrate carrier 10 through the manual port 200.

Although FIGS. 1 and 2 show that the stocker device 400 is provided with the substrate carrier 10 only through the manual port 200, embodiments are not necessarily limited thereto. For example, in some embodiments, the stocker device 400 receives the substrate carrier 10 from an OHT (overhead hoist transport) that raises and lowers a wafer loading box using a hoist and an OHS (overhead shuttle) that horizontally slides the wafer load.

The controller 500 controls the loader device 100, the manual port 200, the transport robot 300, and the stocker device 400.

The controller 500 controls the loader device 100 to transfer the substrate carrier 10. Specifically, the controller 500 controls the loader device 100 to transfer the substrate carrier 10 from the transport robot 300 to the manual port 200 in the first mode. The controller 500 controls the loader device 100 to transfer the substrate carrier 10 from the manual port 200 to the transport robot 300 in the second mode.

The controller 500 controls the movement of the transport robot 300. The controller 500 controls the transport robot 300 to transport the substrate carrier 10. For example, the controller 500 controls a flow line of the transport robot 300 according to the position of the loader device 100 that will receive the substrate carrier 10 from the transport robot 300.

The controller 500 may control the stocker device 400 to hold the substrate carrier 10. For example, the controller 500 controls the stocker device 400 to load the substrate carrier 10 inside the stocker device 400. For another example, the controller 500 controls the stocker device 400 to unload the substrate carrier 10.

Figure 3:
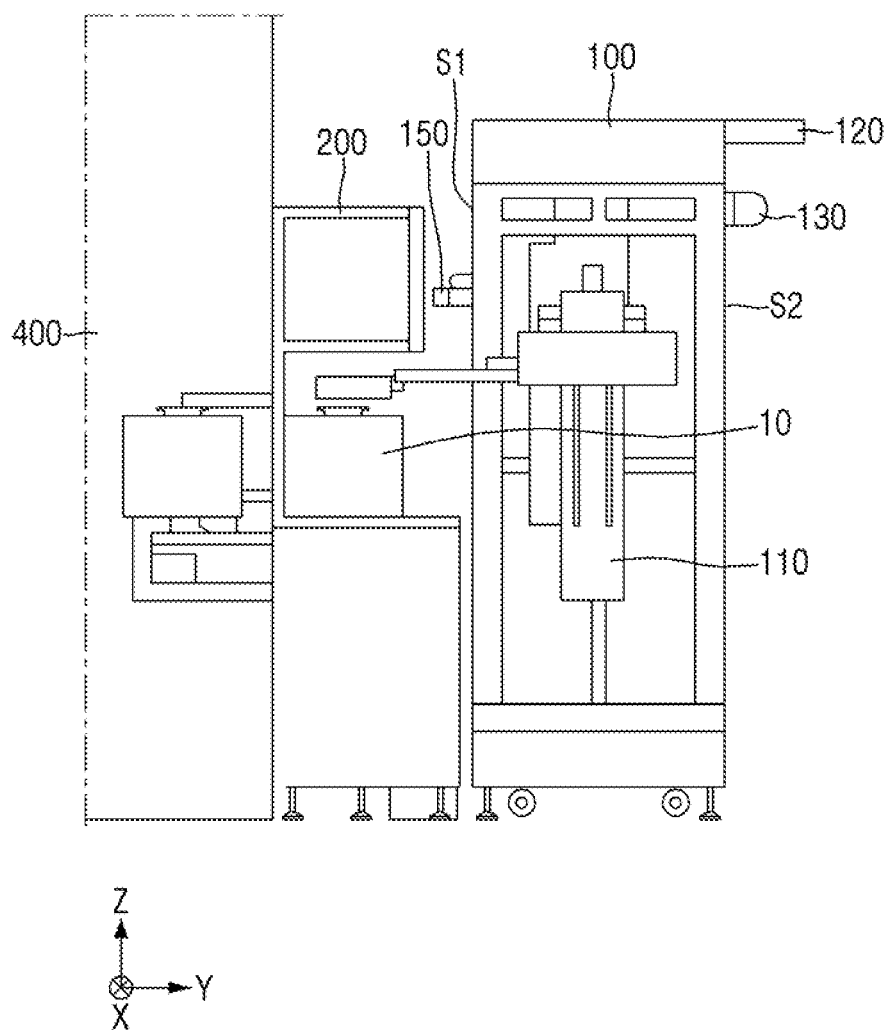
FIG. 3 is a cross-sectional view of a substrate transport system according to some embodiments.
Figure 4:
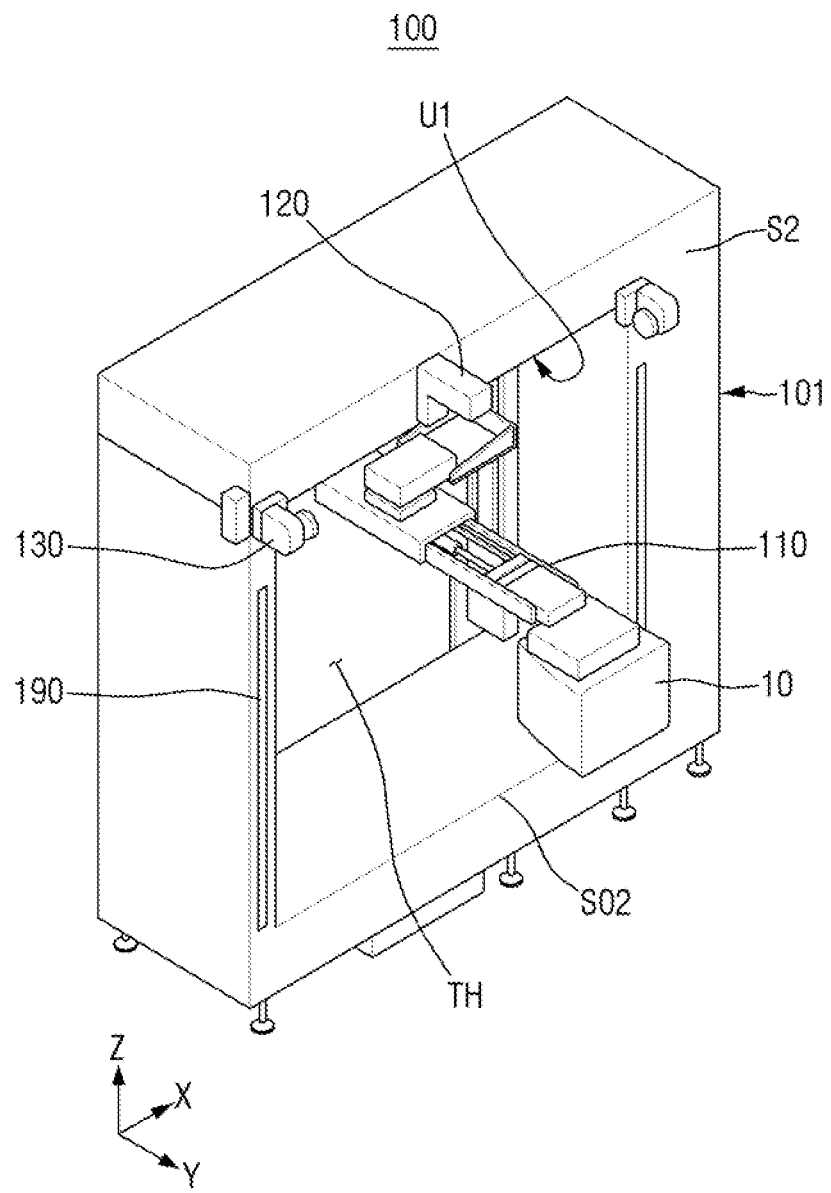
FIG. 4 is a perspective view of a loader device according to some embodiments.
Figure 5:
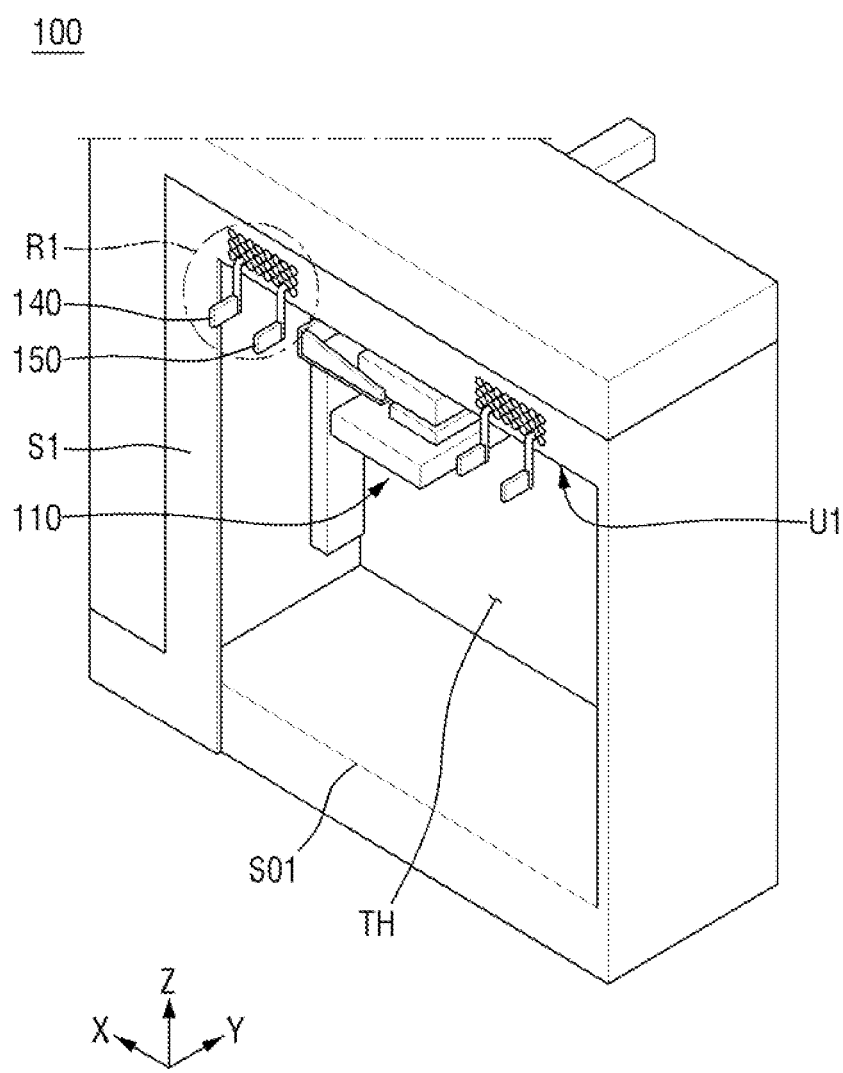
FIG. 5 is a perspective view of a loader device according to some embodiments as viewed from another direction, according to some embodiments.
Figure 6:
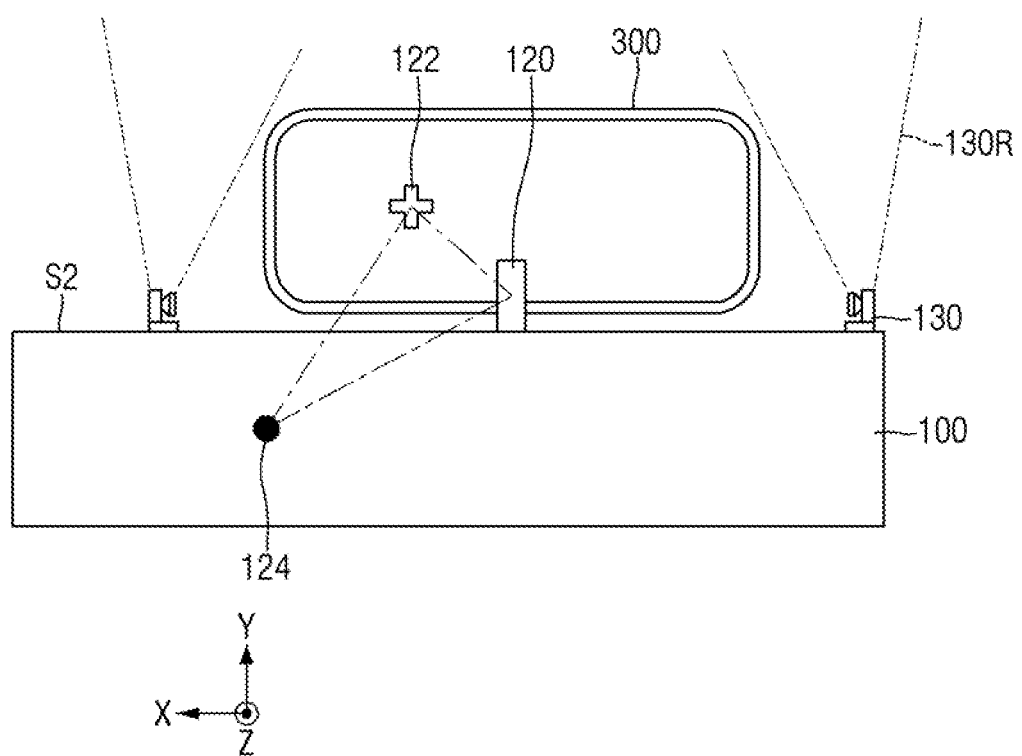
FIG. 6 illustrates a transport robot displacement sensor and a human body access sensing sensor, according to some embodiments.
Figure 7:
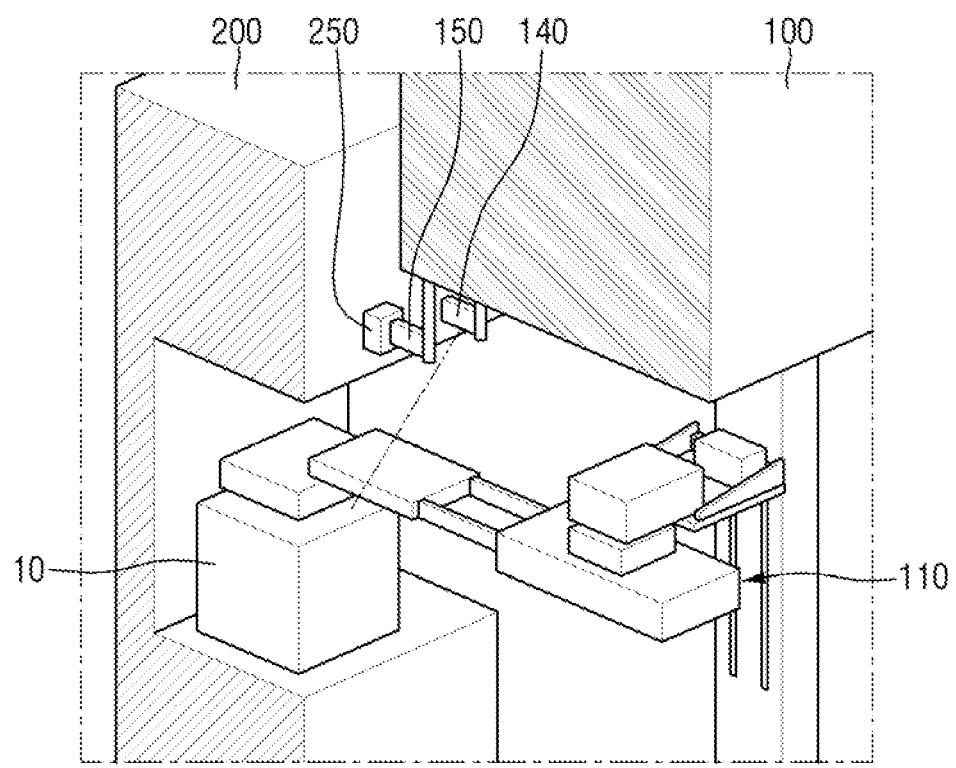
FIG. 7 illustrates a first carrier sensing sensor and a lamp sensing sensor, according to some embodiments.
Figure 8:
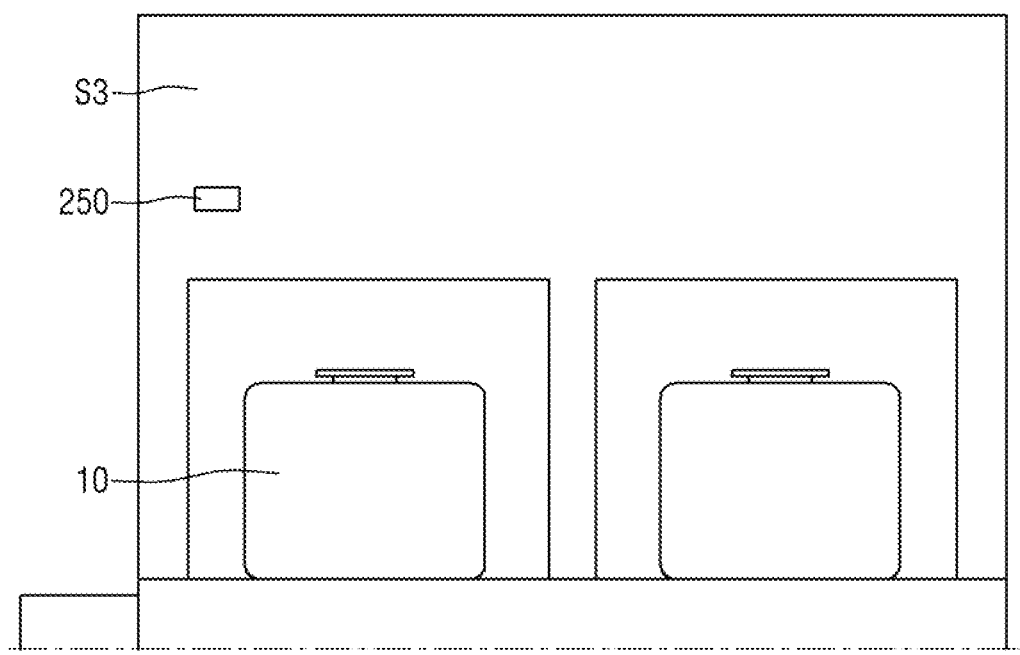
FIG. 8 shows a manual port, according to some embodiments.
Figure 9:
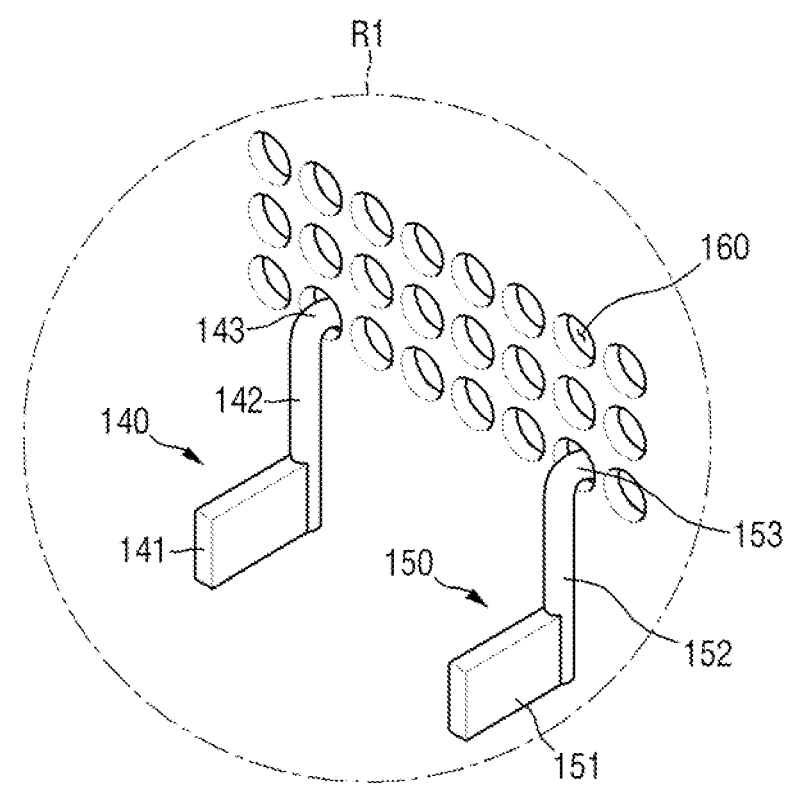
FIG. 9 is an enlarged view of a portion R1 of FIG. 5, according to some embodiments.
Figure 10:
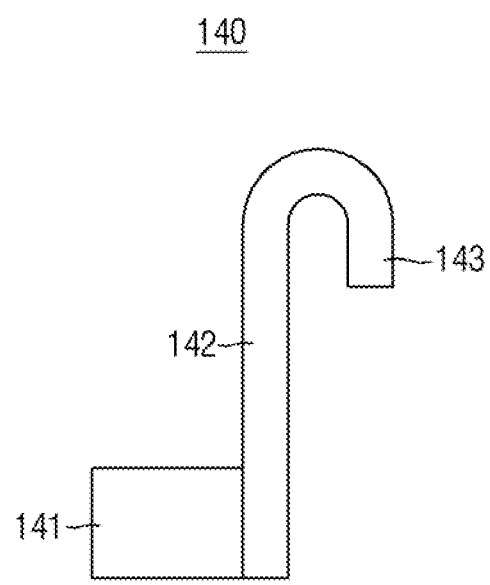
FIG. 10 illustrates a first carrier sensing sensor, according to some embodiments.
Figure 11:
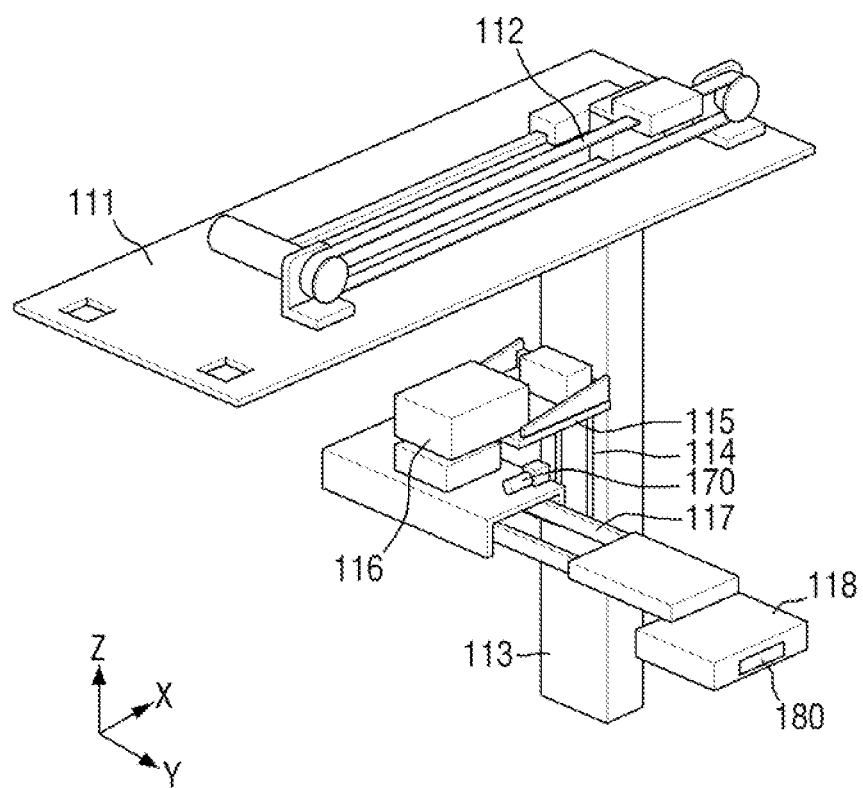
FIG. 11 illustrates a transport robot, according to some embodiments.
Figure 12:
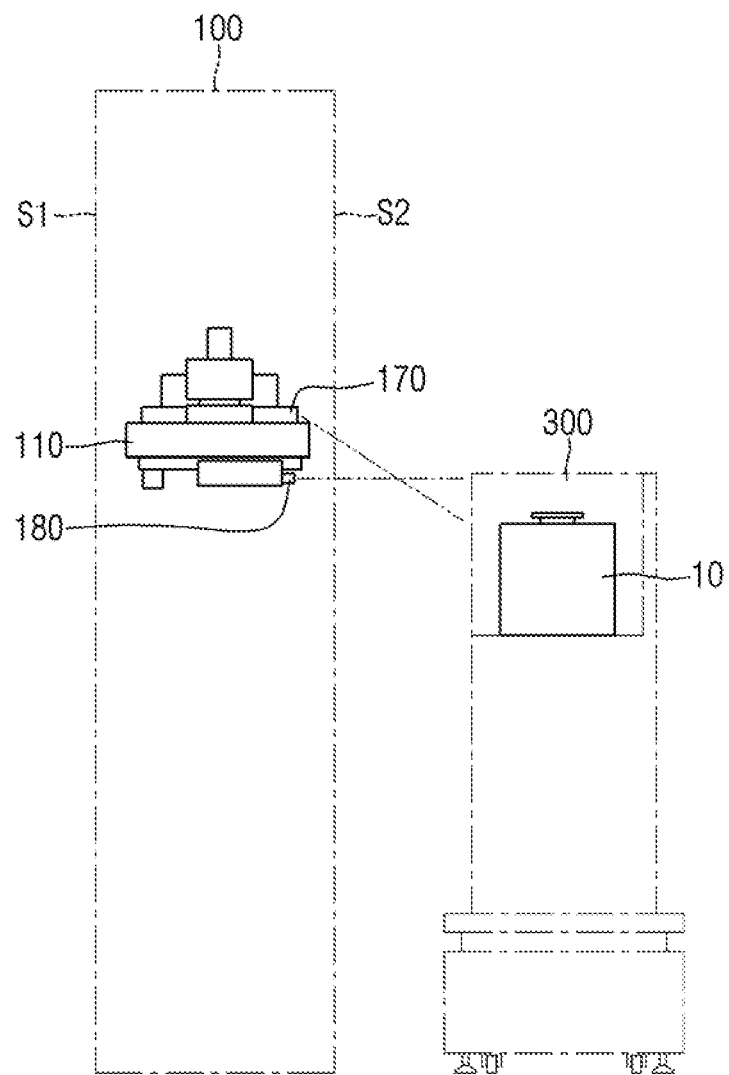
FIG. 12 is a diagram illustrates a second carrier sensing sensor and a transport unit alignment sensor, according to some embodiments.
Figure 13:
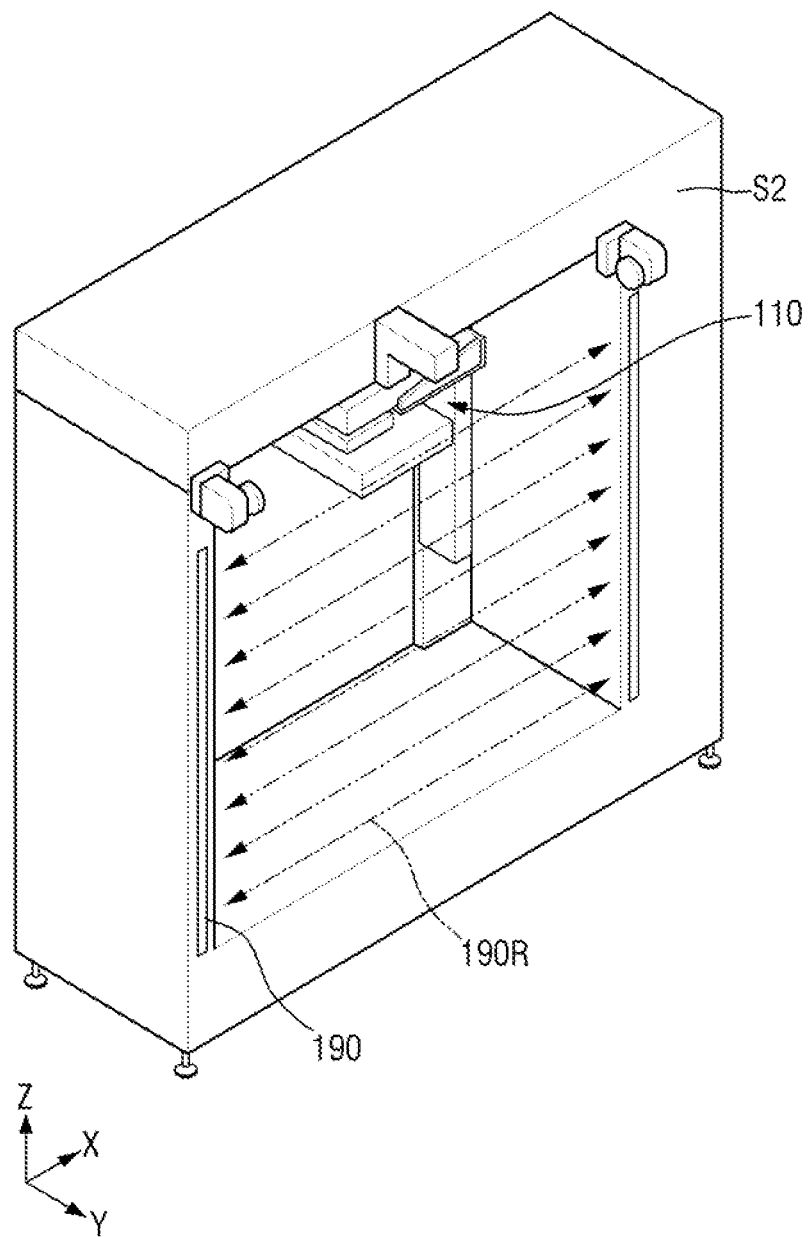
FIGS. 13 and 14 illustrate an access prevention unit, according to some embodiments.
Figure 14:
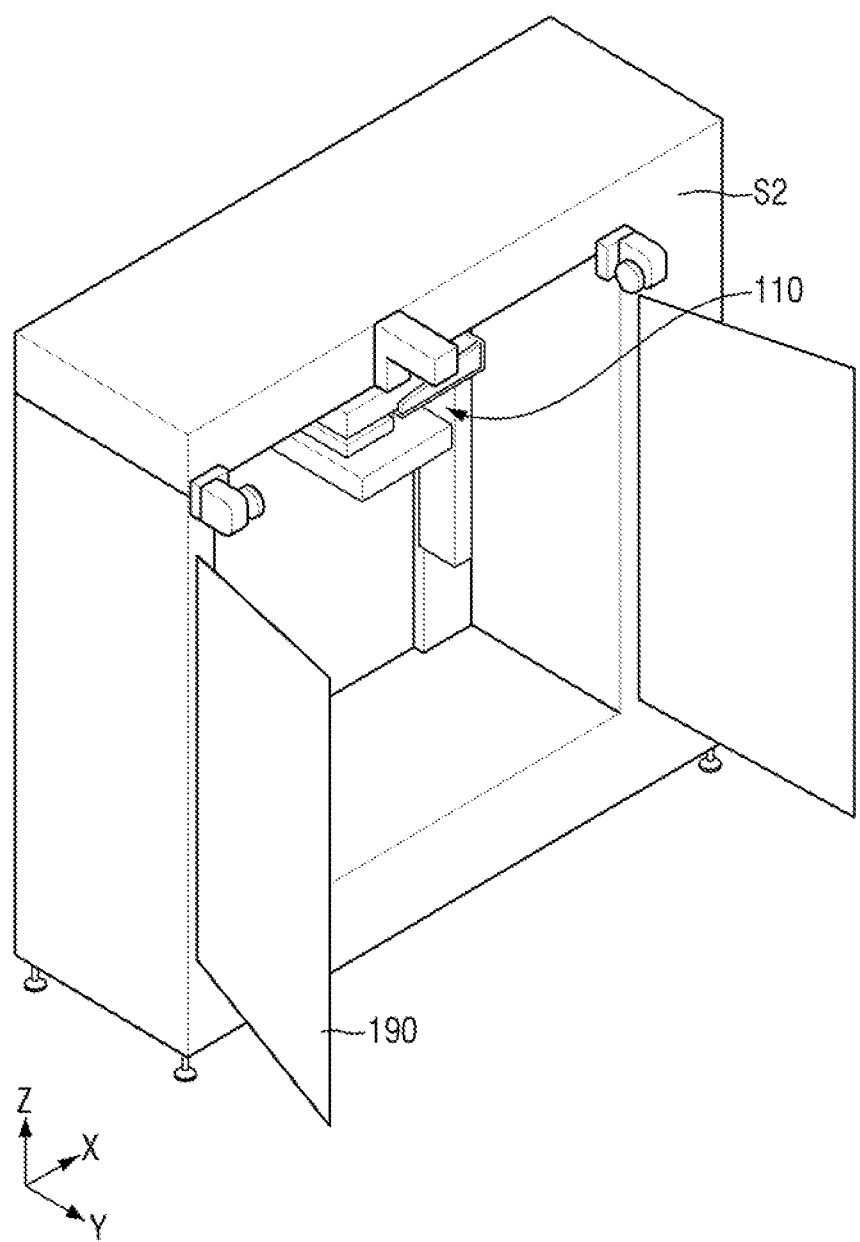

FIG. 3 is a cross-sectional view of a substrate transport system according to some embodiments. FIG. 4 is a perspective view of a loader device according to some embodiments. FIG. 5 is a perspective view of a loader device according to some embodiments as viewed from another direction. FIG. 6 is a illustrates a transport robot displacement sensor and a human body access sensing sensor according to some embodiments. FIG. 7 illustrates a first carrier sensing sensor and a lamp sensing sensor according to some embodiments. FIG. 8 shows a manual port according to some embodiments. FIG. 9 is an enlarged view of a portion R1 of FIG. 5. FIG. 10 illustrates a first carrier sensing sensor according to some embodiments. FIG. 11 illustrates a transport robot according to some embodiments. FIG. 12 illustrates a second carrier sensing sensor and a transport unit alignment sensor according to some embodiments. FIGS. 13 and 14 illustrate an access prevention unit according to some embodiments.

Referring to FIGS. 3 to 5, in some embodiments, the loader device 100 includes a frame 101, a transport unit 110, a transport robot displacement sensor 120, a human body access sensing sensor 130, a first carrier sensing sensor 140, a lamp sensing sensor 150, and an access prevention unit 190.

The frame 101 forms an external shape of the loader device 100. The shape of the frame 101 can have various forms according to an embodiment. For example, the frame 101 of the loader device 100 has a hexahedral shape.

The frame 101 has a hexahedral shape with a cavity TH formed at the center. The frame 101 includes an inner upper surface U1 formed by the cavity TH.

The frame 101 has a first side surface S1 and a second side surface S2. The first side surface S1 and the second side surface S2 are opposite side surfaces of the loader device 100. The first side surface S1 faces the manual port 200. The second side surface S2 faces the transport robot 300.

A first opening SO1 is formed on the first side surface S1. The first opening SO1 is connected to the cavity TH. A second opening SO2 is formed on the second side surface S2. The second opening SO2 is connected to the cavity TH. That is, the frame 101 includes a cavity TH that penetrates from the first opening SO1 of the first side surface S1 to the second opening SO2 of the second side surface S2.

Referring to FIGS. 4 and 6, in some embodiments, the transport robot displacement sensor 120 is placed on the second side surface S2 of the loader device 100. The transport robot displacement sensor 120 is placed at a higher position on the second side surface S2 than a top surface of the transport robot 300.

The transport robot displacement sensor 120 measures the displacement of the transport robot 300 aligned with the second opening SO2. The transport robot displacement sensor 120 transmits a sensor signal with information about the measured displacement of the transport robot 300 to the controller 500.

The controller 500 adjusts the position of the transport unit 110 to be aligned with the transport robot 300 in response to the sensor signal received from the transport robot displacement sensor 120.

The transport robot displacement sensor 120 recognizes a marker 122 of the transport robot 300. The transport robot displacement sensor 120 measures the coordinates of the marker 122 based on zero point coordinates 124 and calculates the displacement of the transport robot 300. The marker 122 is displayed on an outer case of the transport robot 300. Alternatively, in an embodiment, the marker 122 is displayed on the substrate carrier 10 loaded on the transport robot 300. The zero point coordinates 124 are preset at a specific position on the loader device 100.

A method by which the transport robot displacement sensor 120 calculates the displacement of the transport robot 300 can vary according to an embodiment. For example, the transport robot displacement sensor 120 is a QR recognition device that recognizes the marker 122, which has the form of a QR code. For another example, the transport robot displacement sensor 120 calculates the displacement of the transport robot 300 by recognizing the marker 122 using a camera.

The human body access sensing sensor 130 is placed on the second side surface S2 of the loader device 100. The human body access sensing sensor 130 detects access of a person to prevent injury to the person during operation of the loader device 100. The human body access sensing sensor 130 detects the access of a person in a sensing region 130R around the loader device 100. The sensing region 130R of the human body access sensing sensor 130 is preset. The range of the sensing region 130R can change depending on an embodiment.

The human body access sensing sensor 130 senses the approach of a person in various ways, depending on embodiments. For example, in an embodiment, the human body access sensing sensor 130 includes a temperature sensor. The human body access sensing sensor 130 determines that a person is approaching by sensing the body temperature. For another example, in an embodiment, the human body access sensing sensor 130 includes an infrared sensor. For another example, in an embodiment, the human body access sensing sensor 130 detects the approach of a person by using a laser.

Referring to FIGS. 3, 5 and 7, in some embodiments, the first carrier sensing sensor 140 is placed on the first side surface S1 of the loader device 100. The first carrier sensing sensor 140 senses the presence or absence of the substrate carrier 10 adjacent to the first opening SO1. The first carrier sensing sensor 140 senses whether the substrate carrier 10 is present on the manual port 200 adjacent to the first opening SOL. In an embodiment, the first carrier sensing sensor 140 senses whether the substrate carrier 10 is present on the manual port 200 aligned with the first opening SO1. The first carrier sensing sensor 140 senses the presence or absence of the substrate carrier 10 on the manual port 200 in various ways, depending on an embodiment. For example, in an embodiment, the first carrier sensing sensor 140 senses the presence or absence of the substrate carrier 10 on the manual port 200 using a photoelectric sensor. For another example, in an embodiment, the first carrier sensing sensor 140 senses the presence or absence of the substrate carrier 10 on the manual port 200 using a camera.

Referring to FIGS. 3, 5, 7, and 8, in an embodiment, the lamp sensing sensor 150 is placed on the first side surface S1 of the loader device 100. The manual port 200 includes a light-emitting unit 250 that faces the first side surface S1 of the loader device 100. The lamp sensing sensor 150 senses light emitted by the light-emitting unit 250 to the first side surface S1 of the loader device 100.

The light-emitting unit 250 of the manual port 200 is placed on the side surface of the manual port 200. The light-emitting unit 250 indicates an operating state of the substrate transport system 1. For example, when the light-emitting unit 250 emits light of a first color, it indicates that the substrate transport system 1 is in the first mode in which the substrate carrier 10 is loaded on the stocker device 400. When the light-emitting unit 250 emits light of a second color, it indicates that the substrate transport system 1 is in the second mode in which the substrate carrier 10 is unloaded from the stocker device 400.

The lamp sensing sensor 150 transmits a sensor signal that includes information about the light received from the light-emitting unit 250 to the controller 500. The controller 500 determines the mode of the substrate transport system 1 based on the sensor signal received from the lamp sensing sensor 150.

The controller 500 controls the transport unit 110 of the loader device 100 according to the mode determined by the lamp sensing sensor 150 based on the sensor signal.

Referring to FIGS. 3, 5, 9 and 10, in some embodiments, the loader device 100 includes a plurality of insertion holes 160. The plurality of insertion holes 160 are formed on the first side surface S1 of the loader device 100.

The first carrier sensing sensor 140 and the lamp sensing sensor 150 are fixed to some of a plurality of insertion holes 160. The first carrier sensing sensor 140 and the lamp sensing sensor 150 are fixed to the first side surface S1 of the loader device 100 through at least some of the plurality of insertion holes 160. The positions of the first carrier sensing sensor 140 and the lamp sensing sensor 150 to be fixed to the first side surface S1 can change depending on the positions of the insertion holes 160. For example, the positions of the first carrier sensing sensor 140 and the lamp sensing sensor 150 are not fixed and can change, depending on the positions of the insertion holes 160.

The first carrier sensing sensor 140 includes a first sensor portion 141, a first connecting unit 142, and a first hook portion 143. The first sensor portion 141 senses the presence or absence of the substrate carrier 10 adjacent to the first opening SO1. In an embodiment, the first sensor portion 141 senses the presence or absence of the substrate carrier 10 aligned with the first opening SO1. The first connecting portion 142 connects the first sensor portion 141 and the first hook portion 143. The first hook portion 143 is inserted into one insertion hole 160. The first hook portion 143 is curved from the first connecting unit 142 so that the first connecting unit 142 and the first hook portion 143 together have a hook-like shape.

Similarly, the lamp sensing sensor 150 includes a second sensor portion 151, a second connecting portion 152, and a second hook portion 153. The second hook portion 153 is inserted into one insertion hole 160. The second sensor portion 151, the second connecting portion 152, and the second hook portion 153 are substantially the same as the first sensor portion 141, the first connecting portion 142, and the first hook portion 143.

Referring to FIGS. 3 to 5, the transport unit 110 is placed in the cavity TH of the frame 101. Specifically, the transport unit 110 is placed on the inner upper surface U1 of the frame 101.

The transport unit 110 transfers the substrate carrier 10 between the manual port 200 and the transport robot 300. The transport unit 110 provides the substrate carrier 10 through the first opening SO1 to the manual port 200. The transport unit 110 acquires the substrate carrier 10 from the manual port 200 through the first opening SO1. The transport unit 110 provides the substrate carrier 10 through the second opening SO2 to the transport robot 300. The transport unit 110 acquires the substrate carrier 10 from the transport robot 300 through the second opening SO2.

Referring to FIG. 11, in an embodiment, the transport unit 110 includes a fixing plate 111, a traveling shaft 112, an elevating shaft 113, an elevating rail 114, an elevating plate 115, a rotary shaft 116, a fork shaft 117, a hand unit 118, a second carrier sensing sensor 170, and a transport unit alignment sensor 180.

The fixing plate 111 is placed on the inner upper surface U1 of the frame 101. The transport unit 110 is placed in the loader device 100 by fixing the fixing plate 111 to the inner upper surface U1 of the frame 101.

The traveling shaft 112 is placed on the fixing plate 111. The traveling shaft 112 extends in a first direction X. The transport unit 110 moves along the traveling shaft 112 in the first direction X. For example, the position of the transport unit 110 in the first direction X is adjusted along the traveling shaft 112.

The elevating shaft 113 is connected to the traveling shaft 112. For example, an upper end of the elevating shaft 113 is fixed to the traveling shaft 112. The elevating shaft 113 extends in a third direction Z. The elevating shaft 113 includes the elevating rail 114. The elevating plate 115 moves in the third direction Z along the elevating rail 114. For example, the position of the transport unit 110 in the third direction Z is adjusted along the elevating shaft 113.

The rotary shaft 116 is connected to the elevating shaft 113. The rotary shaft 116 is connected to the elevating shaft 113 by the elevating plate 115, and moves up and down in the third direction Z along the elevating rail 114.

The rotary shaft 116 rotates in a plane parallel to the fixing plate 111. For example, the rotary shaft 116 rotates in a plane parallel to the upper surface of the frame 101 on which the fixing plate 111 is placed. The rotary shaft 116 rotates in a plane defined by the first direction X and a second direction Y. The rotary shaft 116 rotates so that the hand unit 118 connected to the rotary shaft 116 moves between the first opening SO1 and the second opening SO2. For example, the position of the transport unit 110 in the plane defined by the first direction X and the second direction Y is adjusted by the rotary shaft 116.

The fork shaft 117 is connected to the rotary shaft 116. The fork shaft 117 moves linearly from the rotary shaft 116. For example, the fork shaft 117 extends from the rotary shaft 116. The fork shaft 117 can be pulled out from the rotary shaft 116. Alternatively, in an embodiment, the fork shaft 117 extended from the rotary shaft 116 can move back toward the rotary shaft 116.

The hand unit 118 is connected to the fork shaft 117. The hand unit 118 can grip the substrate carrier 10. The hand unit 118 includes a gripper that grips the substrate carrier 10. The hand unit 118 transfers and receives the substrate carrier 10 to and from the manual port 200 or the transport robot 300, as the fork shaft 117 moves linearly.

Referring to FIGS. 11 and 12, in an embodiment, the second carrier sensing sensor 170 is placed on the side portion of the rotary shaft 116. The second carrier sensing sensor 170 senses the presence or absence of the substrate carrier 10 adjacent to the second opening SO2 of the second side surface S2. The second carrier sensing sensor 170 detects whether the substrate carrier 10 is present on the transport robot 300 adjacent to the second opening SO2.

The second carrier sensing sensor 170 can sense the presence or absence of the substrate carrier 10 in various ways, depending on an embodiment. For example, the second carrier sensing sensor 170 senses the presence or absence of the substrate carrier 10 by using a photoelectric sensor. For another example, the second carrier sensing sensor 170 senses the presence or absence of the substrate carrier 10 by using a camera.

The transport unit alignment sensor 180 is placed on the hand unit 118. The transport unit alignment sensor 180 detects whether the transport unit 110 is aligned with the transport robot 300. The transport unit alignment sensor 180 detects whether the position of the hand unit 118 is aligned with the position of the transport robot 300, after the position of the hand unit 118 is adjusted by using the traveling shaft 112, the elevating shaft 113, the rotary shaft 116, and the fork shaft 117. The transport unit alignment sensor 180 provides the controller 500 with a sensor signal that includes information on whether the hand unit 118 is aligned with the position of the transport robot 300.

When the hand unit 118 is not aligned with the position of the transport robot 300, the controller 500 adjusts the position of the hand unit 118 based on the sensor signal received from the transport unit alignment sensor 180. For example, the controller 500 readjusts the position of the hand unit 118 with respect to the transport robot 300 by using the traveling shaft 112, the elevating shaft 113, the rotary shaft 116, and the fork shaft 117.

Referring to FIGS. 4, 13 and 14, in an embodiment, the access prevention unit 190 is placed on the second side surface S2 of the loader device 100. The access prevention unit 190 prevents an access to the second opening SO2 of the loader device 100. The access prevention unit 190 can prevent access in various ways, depending on an embodiment.

For example, in an embodiment as shown in FIG. 13, the access prevention unit 190 forms an access prevention region 190R by using a light curtain. When the access prevention unit 190 senses an access to the access prevention area 190R, the access prevention unit 190 provides a signal notifying the access to the controller 500.

For another example, in an embodiment as shown in FIG. 14, the access prevention unit 190 physically prevents access. The access prevention portion 190 is placed on both sides of the second opening SO2 as a plate-like shielding film structure. In an embodiment, the plate-like shielding film structure includes two doors, each rotatably attached to one side of the second opening SO2 so that the doors can open and close. When the loader device 100 includes the plate-shaped shielding film structure access prevention portion 190, the transport robot 300 is aligned with the second opening SO2 between the access prevention portions 190.

Figure 15:
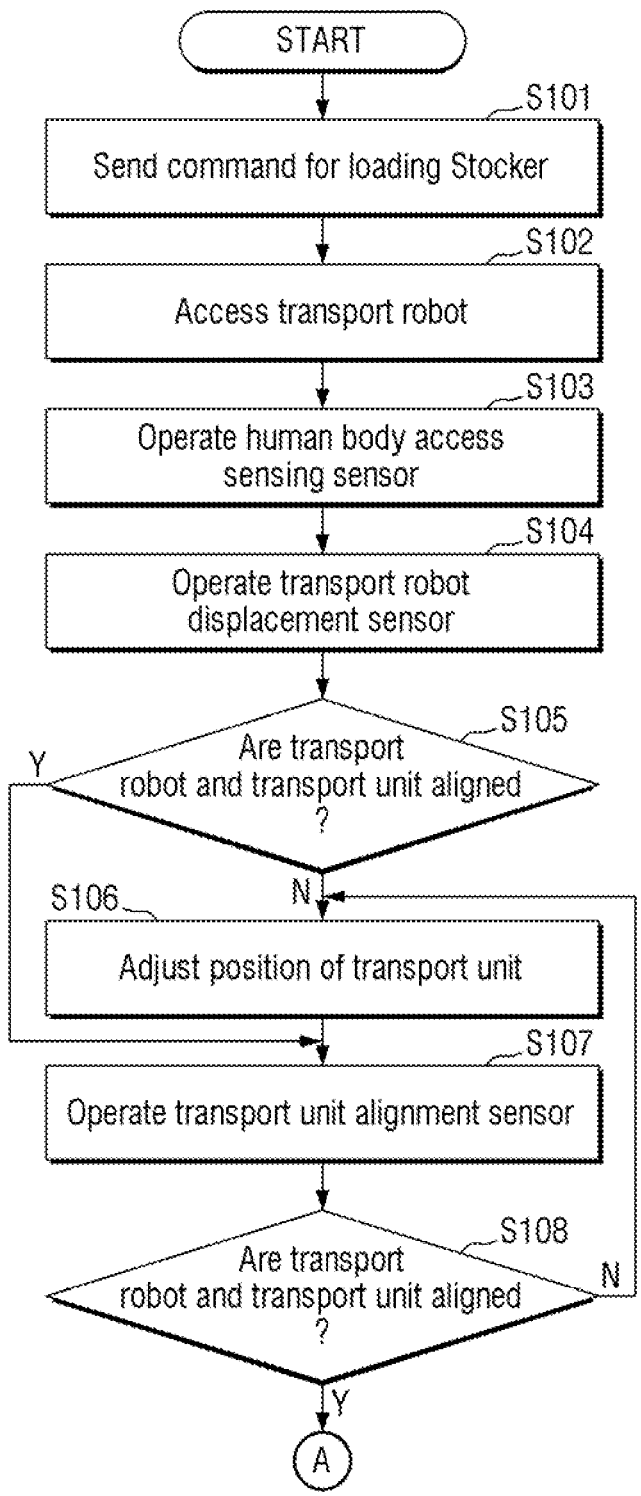
FIGS. 15 and 16 are flowcharts of a loading operation of a substrate transport system, according to some embodiments.
Figure 16:
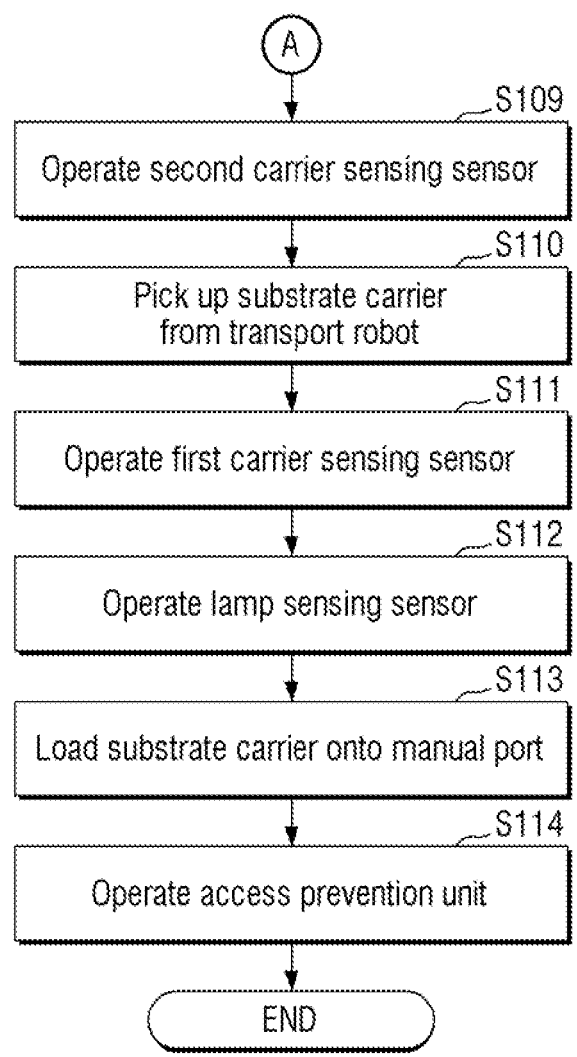
Figure 17:
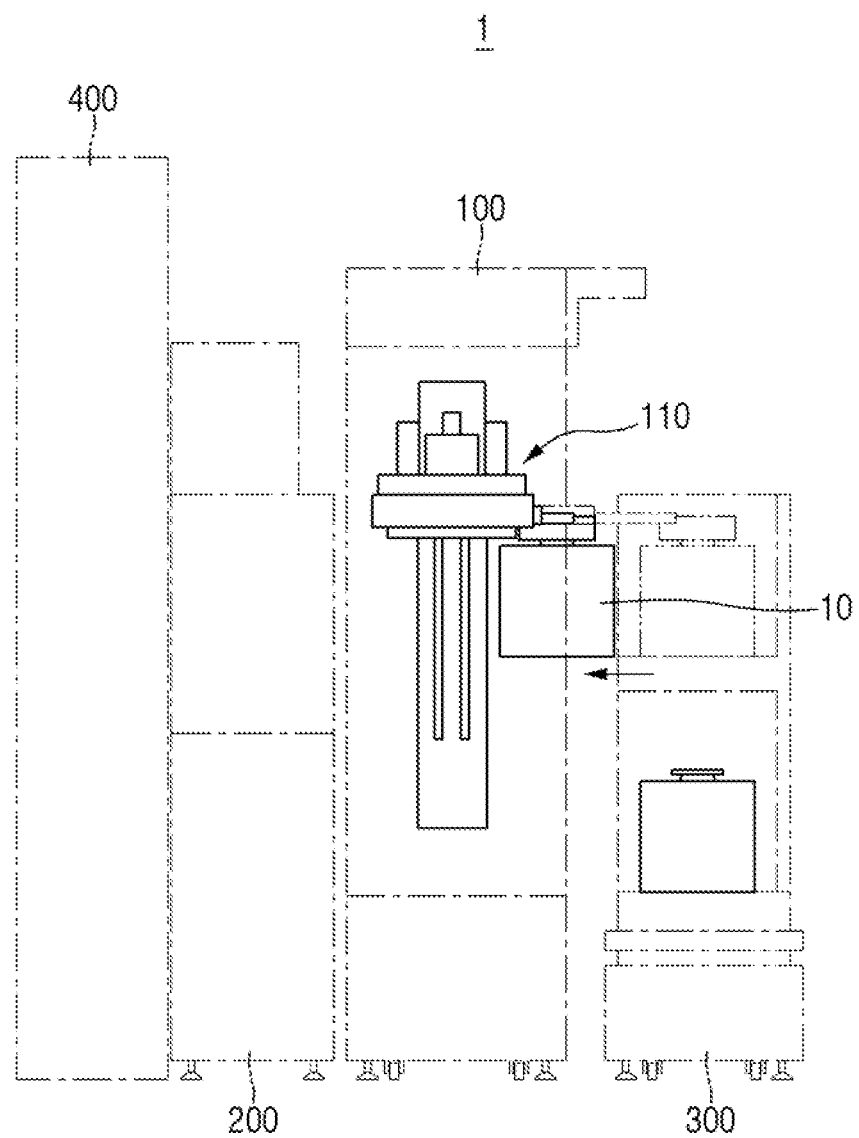
FIGS. 17 to 19 illustrate a loading operation of the loader device, according to some embodiments.
Figure 18:
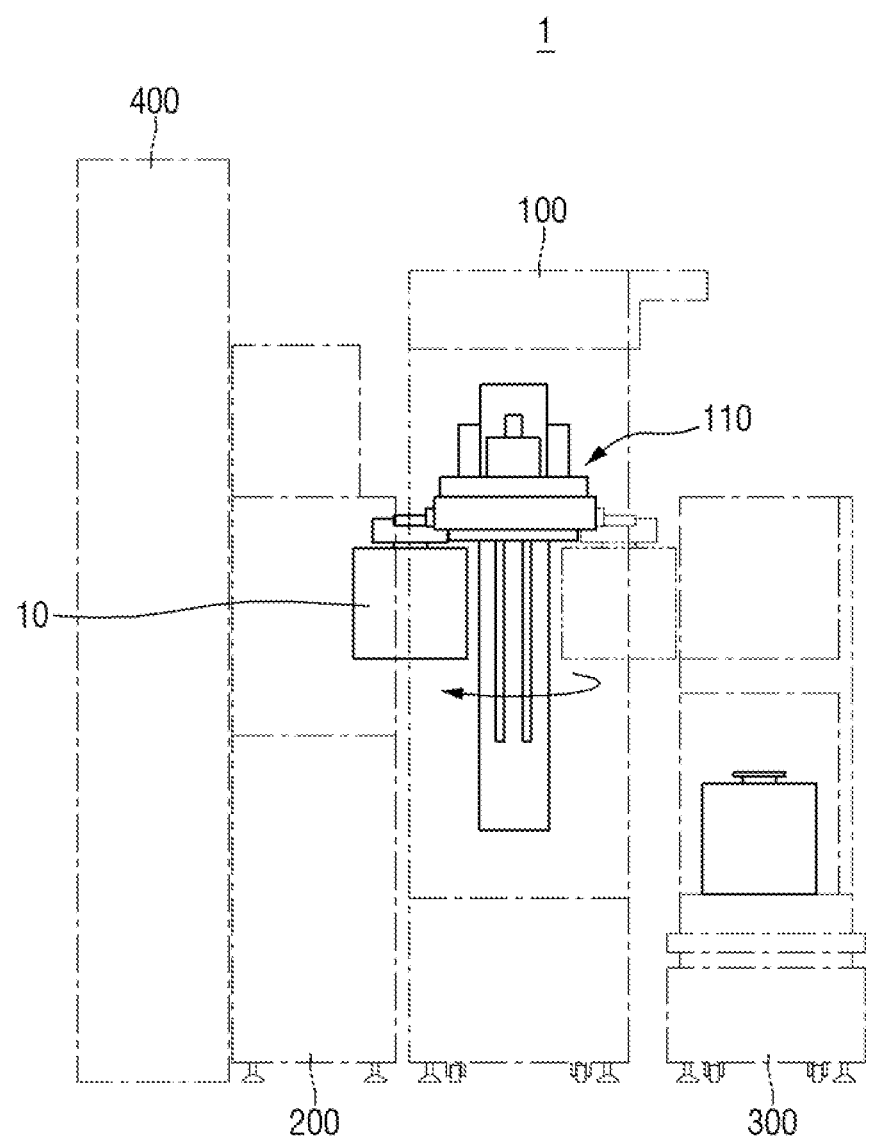
Figure 19:
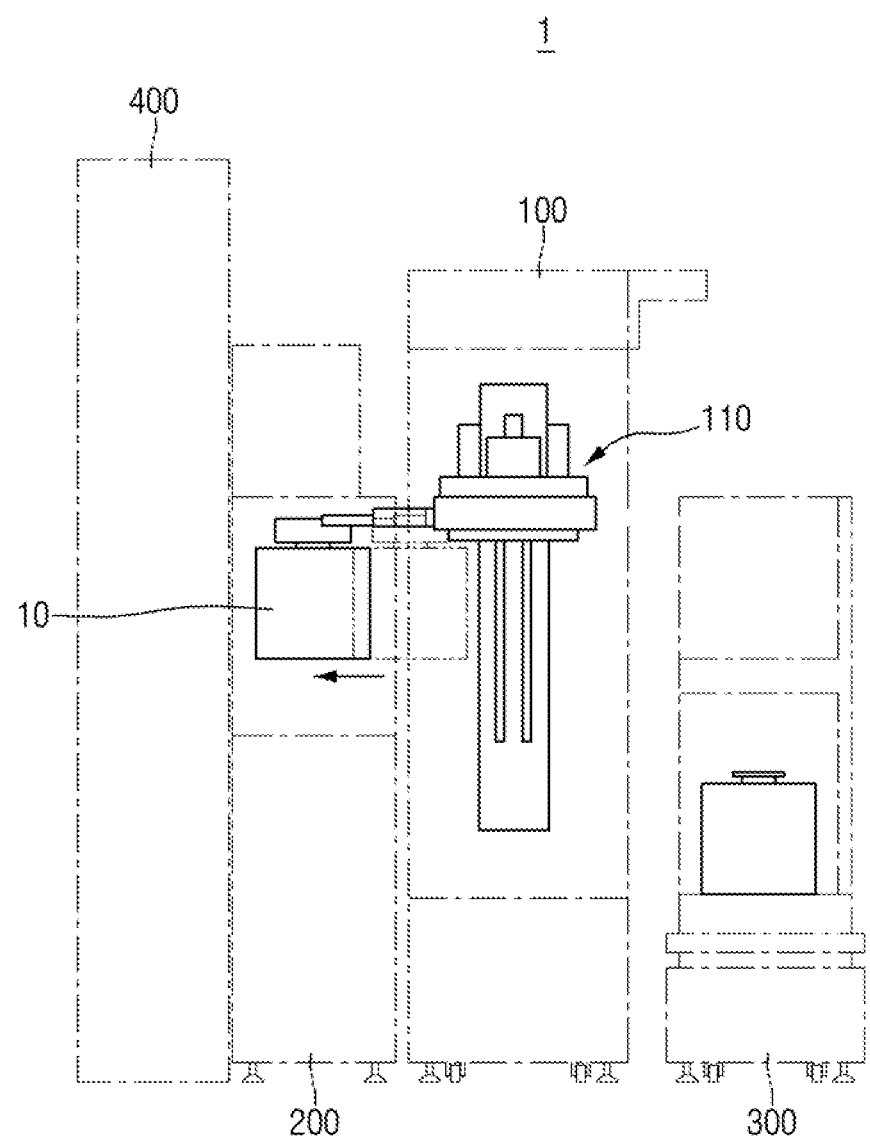

FIGS. 15 and 16 are flowcharts of a loading operation of a substrate transport system, according to an embodiment. FIGS. 17 to 19 illustrate a loading operation of a loader device. For reference, the loading operation of a substrate transport system refers to an operation of a substrate transport system in the first mode.

Referring to FIGS. 2, 15 and 16, in an embodiment, the controller 500 sends a command to the loader device 100 for loading the stocker device 400 (S101).

The transport robot 300 accesses the loader device 100 (S102).

For example, in an embodiment, referring to FIGS. 2 and 4, the transport robot 300 is placed in front of the second side surface S2 of the loader device 100. The transport robot 300 accesses the front of the second opening SO2 of the loader device 100.

Referring to FIGS. 4, 15 and 16 again, the human body access sensor 130 operates (S103).

For example, in an embodiment, referring to FIG. 6, the human body access detection sensor 130 can detect access of a person to the sensing region 130R when the transport robot 300 accesses the second side surface S2 of the loader device 100. When the human body access detection sensor 130 senses access of a person in the sensing region 130R, the human body access detection sensor 130 transmits sensor signal to the controller 500 that notifies of the access of the person.

The controller 500 interrupts the operation of the loader device 100 when access of a person is detected, in response to the sensor signal received from the human body access detection sensor 130.

Referring to FIGS. 4, 15 and 16 again, in an embodiment, the transport robot displacement sensor 120 then operates (S104).

For example, in an embodiment, referring to FIG. 6, when the transport robot 300 accesses the second side surface S2 of the loader device 100, the transport robot displacement sensor 120 measures the displacement of the transport robot 300 with respect to the second opening S02. The transport robot displacement sensor 120 provides the controller 500 with a sensor signal that includes information about the measured displacement of the transport robot 300.

Referring to FIGS. 15 and 16 again, in an embodiment, the substrate transport system 1 then determines whether the transport robot 300 and the transport unit 110 are aligned (S105).

For example, the controller 500 determines whether the transport robot 300 and the transport unit 110 are aligned based on the sensor signal received from the transport robot displacement sensor 120 in step S104.

If the transport robot 300 and the transport unit 110 are not aligned, the substrate transport system 1 adjusts the position of the transport unit 110 (S106).

For example, in an embodiment, referring to FIGS. 1 and 11, the controller 500 adjusts the position of the transport unit 110 to align the transport unit 110 with the transport robot 300, using the traveling shaft 112, the elevating shaft 113, the rotary shaft 116, and the fork shaft 117 of the transport unit 110.

Referring to FIGS. 11, 15 and 16, in an embodiment, when the transport robot 300 and the transport unit 110 are aligned, the transport unit alignment sensor 180 operates (S107).

For example, the transport unit alignment sensor 180 detects whether the hand unit 118 of the transport unit 110 that was adjusted in step S106 is aligned with the transport robot 300. The transport unit alignment sensor 180 provides the controller 500 with a sensor signal that includes information on whether the hand unit 118 is aligned with respect to the position of the transport robot 300.

Referring to FIGS. 15 and 16, in an embodiment, the substrate transport system 1 determines again whether the transport robot 300 and the transport unit 110 are aligned (S108).

Referring to FIGS. 11, 15 and 16, in an embodiment, when the transport robot 300 and the transport unit 110 are aligned, the second carrier sensing sensor 170 operates (S109).

For example, in an embodiment, referring to FIGS. 11 and 12, the second carrier sensing sensor 170 detects whether the substrate carrier 10 is present on the transport robot 300. The second carrier sensing sensor 170 provides the controller 500 with a sensor signal that includes information about the presence or absence of the substrate carrier 10 on the transport robot 300.

Referring to FIGS. 15 and 16 again, in an embodiment, the substrate transport system 1 picks up the substrate carrier 10 from the transport robot 300 (S110).

For example, in an embodiment, referring to FIGS. 12 and 15 to 17, when the second carrier sensing sensor 170 senses the presence of the substrate carrier 10 on the transport robot 300, the transport unit 110 picks up the substrate carrier 10 from the transport robot 300. When the substrate carrier 10 is present on the transport robot 300, the controller 500 controls the transport unit 110 to pick up the substrate carrier 10 from the transport robot 300, based on the sensor signal received from the second carrier sensing sensor 170 in step S109.

Referring to FIGS. 5, 15 and 16 again, in an embodiment, the first carrier sensing sensor 140 then operates (S11).

For example, in an embodiment, referring to FIG. 7, the first carrier sensing sensor 140 senses the presence or absence of the substrate carrier 10 on the manual port 200. The first carrier sensing sensor 140 provides the controller 500 with a sensor signal that includes information about the presence or absence of the substrate carrier 10 on the manual port 200.

Referring to FIGS. 5, 15 and 16 again, in an embodiment, the lamp detection sensor 150 then operates (S112).

For example, in an embodiment, referring to FIG. 7, the lamp sensing sensor 150 senses light emitted from the light-emitting unit 250 of the manual port 200. The lamp sensing sensor 150 provides the controller 500 with a sensor signal that includes information about the light emitted from the light-emitting unit 250.

Referring again to FIGS. 2, 15 and 16, in an embodiment, the substrate transport system 1 then loads the substrate carrier 10 into the manual port 200 (S113).

For example, in an embodiment, referring to FIGS. 2, 7, 18, and 19, the controller 500 receives the sensor signal that indicates that substrate carrier 10 is not present on the manual port 200 from the first carrier sensing sensor 140 in step S111. Further, the controller 500 receives a sensor signal that indicates that the stocker device 400 is in the first mode from the lamp detection sensor 150 in step S112. The controller 500 controls the transport unit 110 to transfer the substrate carrier 10 from the loader device 100 to the manual port 200.

Even if the controller 500 receives a sensor signal from the first carrier detection sensor 140 that indicates that the substrate carrier 10 is not present on the manual port 200, when the controller 500 receives a sensor signal from the lamp detection sensor 150 that indicates that the stocker device 400 is in the second mode, the controller 500 controls the transport unit 110 to not transfer the substrate carrier 10 from the loader device 100 to the manual port 200.

Even if the controller 500 receives a sensor signal from the lamp detection sensor 150 that indicates that the stocker device 400 is in the first mode, when the controller 500 receives the sensor signal from the first carrier detection sensor 140 that indicates that the substrate carrier 10 is present on the manual port 200, the controller 500 controls the transport unit 110 to not transfer the substrate carrier 10 from the loader device 100 to the manual port 200.

The controller 500 controls the traveling shaft 112, the elevating shaft 113, the rotary shaft 116, and the fork shaft 117 of the transport unit 110 so that the transport unit 110 transfers the substrate carrier 10 received from the transport robot 300 to the manual port 200 in step S110.

Referring to FIGS. 4, 15 and 16 again, in an embodiment, subsequently, the access prevention unit 190 operates (S114).

For example, in an embodiment, referring to FIGS. 13 and 14, after the transport unit 110 transfers the substrate carrier 10 from the loader device 100 to the manual port 200 in step S113 and the transport robot 300 is removed from the loader device 100, the access prevention unit 190 operates. The access prevention unit 190 prevents access to the second opening SO2 of the loader device 100.

Figure 20:
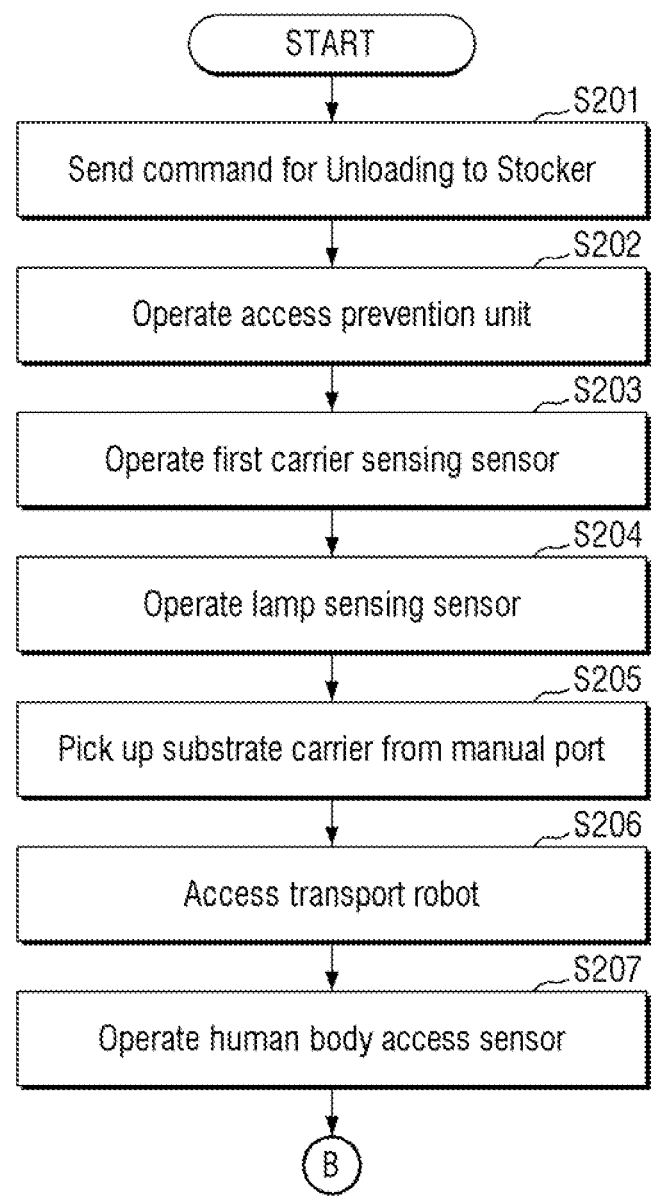
FIGS. 20 and 21 are flowcharts of an unloading operation of a substrate transport system, according to some embodiments.
Figure 21:
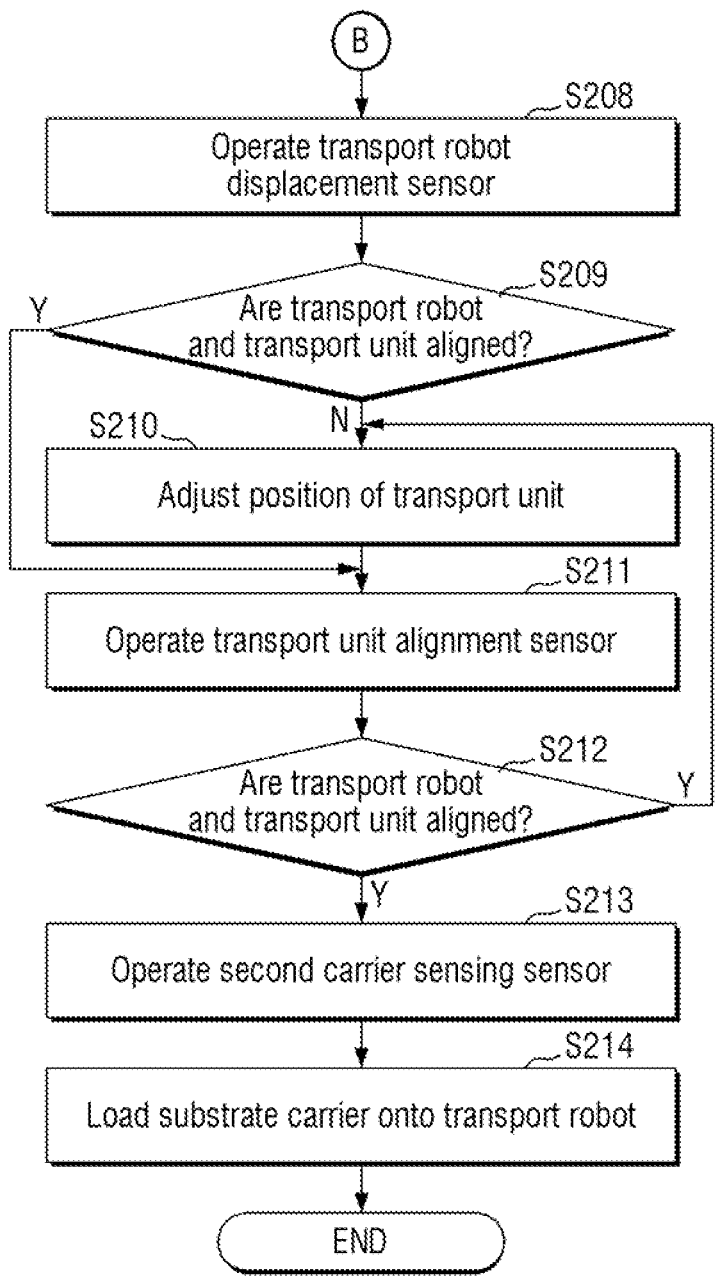
Figure 22:
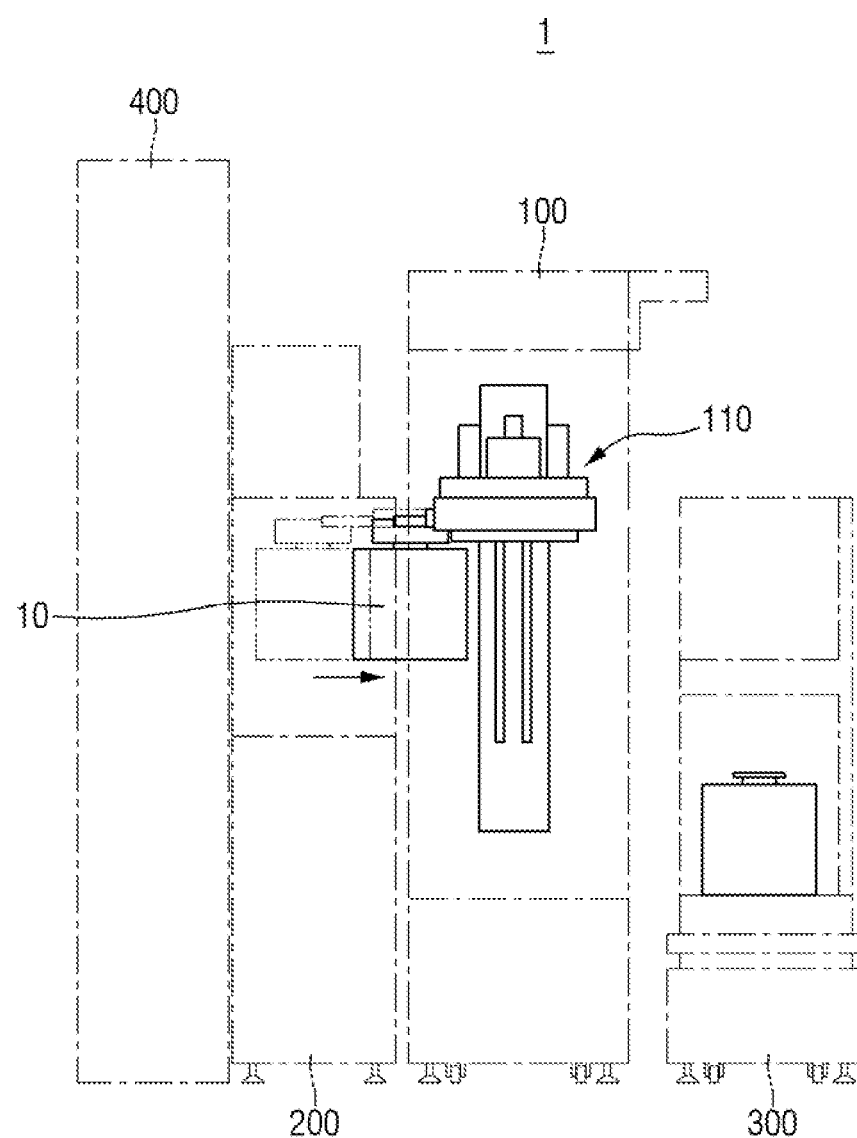
FIGS. 22 to 24 illustrate an unloading operation of a loader device, according to some embodiments.
Figure 23:
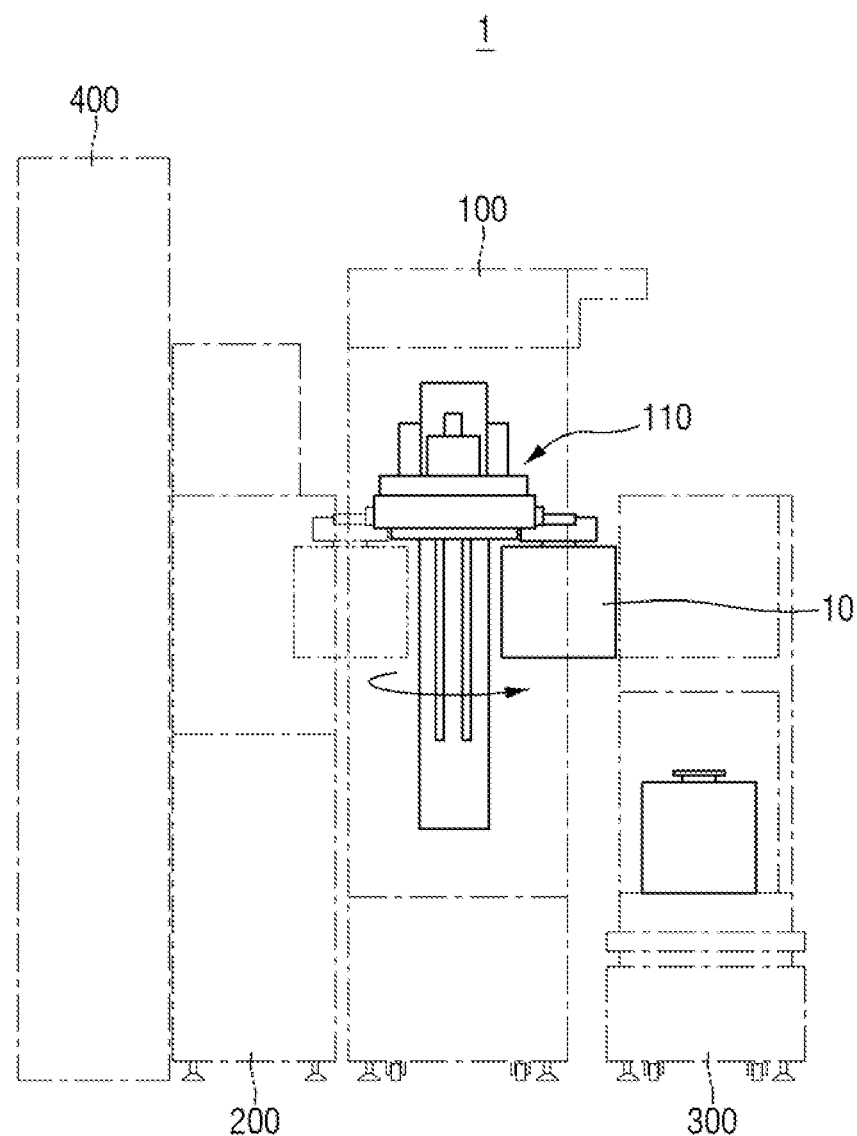
Figure 24:
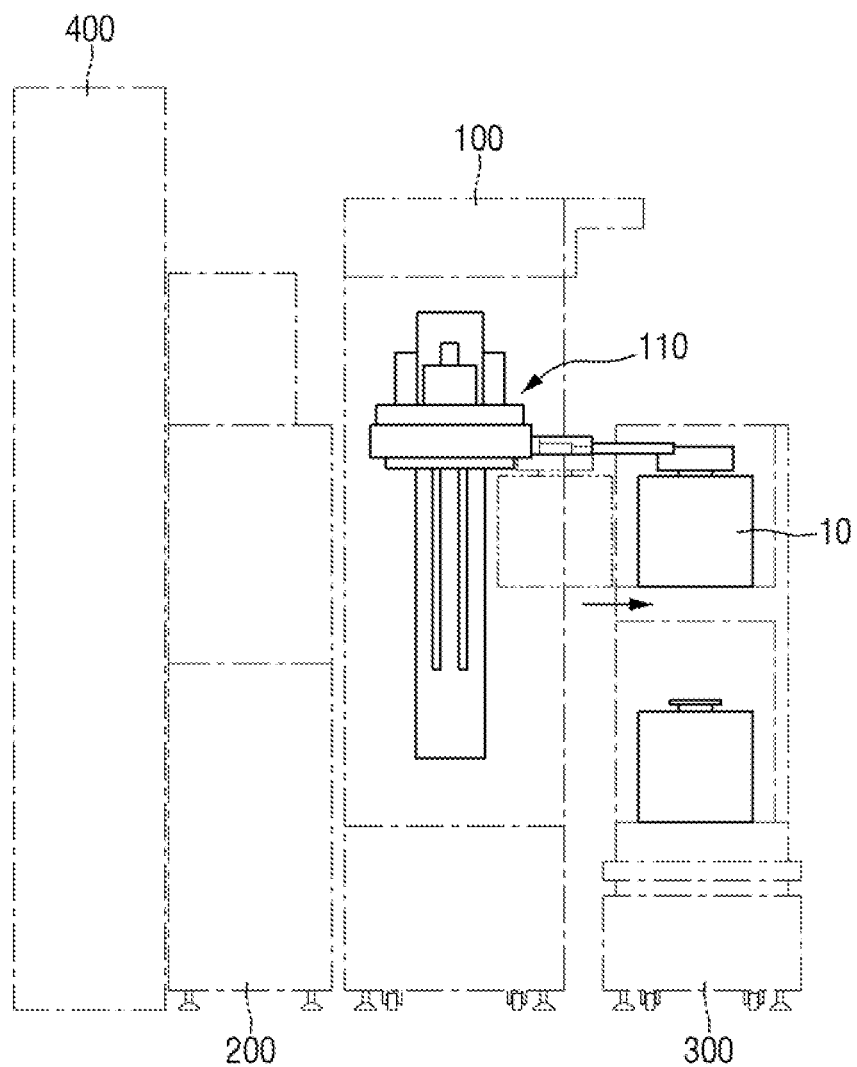

FIGS. 20 and 21 are flowcharts of an unloading operation of a substrate transport system according to an embodiment. FIGS. 22 to 24 illustrate an unloading operation of a loader device. For reference, an unloading operation of a substrate transport system refers to an operation of a substrate transport system in the second mode. For convenience of explanation, steps that differ from those described with reference to FIGS. 15 to 19 will be mainly described.

Referring to FIGS. 2, 20 and 21, in an embodiment, the controller 500 sends a command to the loader device 100 for unloading from the stocker device 400 (S201).

Referring to FIGS. 4, 20 and 21, in an embodiment, the access prevention unit 190 operates (S202).

For example, the access prevention unit 190 prevents access to the second opening SO2 of the loader device 100.

Referring to FIGS. 5, 20 and 21, in an embodiment, the first carrier sensing sensor 140 operates (S203).

The lamp sensing sensor 150 operates (S204).

The substrate transport system 1 picks up the substrate carrier 10 from the manual port 200 (S205).

For example, in an embodiment, referring to FIGS. 7 and 20 to 22, when the first carrier sensing sensor 140 senses the presence of the substrate carrier 10 on the manual port 200, the transport unit 110 picks up the substrate carrier from the manual port 200. The controller 500 controls the transport unit 110 to pick up the substrate carrier 10 from the manual port 200 based on the sensor signal received from the first carrier sensing sensor 140 in step S203.

The controller 500 receives from the first carrier sensing sensor 140 a sensor signal that indicates that the substrate carrier 10 is present in the manual port 200, in step S203. The controller 500 receives from the lamp detection sensor 150 a sensor signal that indicates that the stocker device 400 is in a second mode, in step S204. The controller 500 controls the transport unit 110 to pick up the substrate carrier 10 from the manual port 200.

Even if the controller 500 receives from the first carrier detection sensor 140 a sensor signal that indicates that the substrate carrier 10 is present in the manual port 200, when the controller 500 receives from the lamp detection sensor 150 a sensor signal that indicates that the stocker device 400 is in the first mode, the controller 500 controls the transport unit 110 to not pick up the substrate carrier 10 from the manual port 200.

Even if the controller 500 receives from the lamp detection sensor 150 a sensor signal that indicates that the stocker device 400 is in the second mode, when the controller 500 receives from the first carrier detection sensor 140 a sensor signal that indicates that the substrate carrier 10 is not present in the manual port 200, the controller 500 controls the transport unit 110 to not pick up the substrate carrier 10 from the manual port 200.

Referring to FIGS. 1, 20, and 21, in an embodiment, the transport robot 300 accesses the loader device 100 (S206).

Referring to FIGS. 4, 20 and 21, in an embodiment, the human body access sensor 130 operates (S207).

The transport robot displacement sensor 120 operates (S208).

Referring to FIGS. 1, 20, and 21, in an embodiment, the substrate transport system 1 determines whether the transport robot 300 and the transport unit 110 are aligned (S209).

When the transport robot 300 and the transport unit 110 are not aligned, the substrate transport system 1 adjusts the position of the transport unit 110 (S210).

Referring to FIGS. 11, 20, and 21, in an embodiment, when the transport robot 300 and the transport unit 110 are aligned, the transport unit alignment sensor 180 operates (S211).

The substrate transport system 1 determines whether the transport robot 300 and the transport unit 110 are aligned again (S212).

When the transport robot 300 and the transport unit 110 are aligned, the second carrier sensing sensor 170 operates (S213).

Referring to FIGS. 2, 20 and 21, in an embodiment, the substrate transport system 1 loads the substrate carrier 10 onto the transport robot 300 (S113).

For example, in an embodiment, referring to FIGS. 2, 12, 23 and 24, the controller 500 receives from the second carrier sensing sensor 170 a sensor signal that indicates that the substrate carrier 10 is not present on the transport robot 300 in step S213. The controller 500 controls the transport unit 110 to transfer the substrate carrier 10 to the transport robot 300.

On the other hand, the controller 500 receives from the second carrier sensing sensor 170 a sensor signal that indicates that the substrate carrier 10 is present on the transport robot 300 in step S213. The controller 500 controls the transport unit 110 to not transfer the substrate carrier 10 onto the transport robot 300.

In concluding the detailed description, those skilled in the art will appreciate that many variations and modifications may be made to embodiments without substantially departing from the principles of the present disclosure. Therefore, embodiments of the disclosure are used in a generic and descriptive sense only and not for purposes of limitation.

What is claimed is:

1. A loader device, comprising:
a frame;
a first opening formed in a first side surface of the frame;
a second opening formed in a second side surface of the frame that is opposite to the first side surface;
a cavity connected to the first opening and the second opening and that penetrates the frame;
a transport unit placed in the cavity and that transfers a substrate carrier between the first opening and the second opening;
a first sensor placed on the first side surface and that senses a presence or absence of a first substrate carrier adjacent to the first opening;
a second sensor placed on the second side surface and senses access of a person in a sensing region of the second sensor around the frame; and
a controller that receives a first sensor signal from the first sensor and receives a second sensor signal from the second sensor,
wherein in response to the first sensor signal that indicates the presence of the first substrate carrier adjacent to the first opening,
the controller controls the transport unit to not transfer a second substrate carrier different from the first substrate carrier into the first opening in a first mode,
the controller controls the transport unit to pick up the first substrate carrier from the first opening in a second mode, and
the controller interrupts operation of the transport unit in response to the second sensor signal that indicates access of the person, wherein the loader device further comprises:
a third sensor placed on the first side surface and that senses light emitted to the first side surface, wherein the controller receives a third sensor signal from the third sensor, and
the controller discriminates the first mode and the second mode based on of the third sensor signal and controls the operation of the transport unit; and
a fourth sensor placed in the transport unit and that senses a presence or absence of the second substrate carrier adjacent to the second opening, wherein the controller receives from the fourth sensor a fourth sensor signal that indicates the presence of the second substrate carrier,
in response to the fourth sensor signal,
the controller controls the transport unit to pick up the second substrate carrier from the second opening in the first mode, and
the controller controls the transport unit to not transport the first substrate carrier into the second opening in the second mode.

2. The loader device of claim 1, further comprising:
a fifth sensor aligned with the second opening and that measures a displacement of a transport robot that loads and unloads the substrate carrier to and from the transport unit.

3. The loader device of claim 2, wherein the controller receives from the fifth sensor a fifth sensor signal that includes information about the displacement of the transport robot, and
the controller adjusts the displacement of the transport unit with respect to the transport robot, in response to the fifth sensor signal.

4. The loader device of claim 3, wherein the transport unit includes
a hand unit that grips the substrate carrier, and
a sixth sensor placed on the hand unit and that measures a position of the hand unit with respect to the transport robot,
wherein the controller receives from the sixth sensor a sixth sensor signal that includes information on whether the hand unit and the transport robot are aligned, and
the controller adjusts the position of the hand unit in response to the sixth sensor signal.

5. The loader device of claim 2, wherein the fifth sensor recognizes a marker placed on the transport robot, and measures the displacement of the transport robot with respect to the second opening based on predetermined zero point coordinates.

6. The loader device of claim 1, wherein the transport unit includes
a traveling shaft that extends parallel to an upper surface of the frame,
an elevating shaft connected to the traveling shaft and that extends in a direction perpendicular to the upper surface,
a rotary shaft connected to the elevating shaft and that rotates parallel to the upper surface between the first opening and the second opening,
a fork shaft fixed to the rotary shaft and that linearly moves parallel to the upper surface, and
a hand unit connected to the fork shaft and that grips the substrate carrier.

7. The loader device of claim 1, further comprising:
a plurality of insertion holes formed in the first side surface,
wherein the first sensor includes a hook portion at one end, and
the hook portion is inserted into one of the plurality of insertion holes.

8. The loader device of claim 1, further comprising:
an access prevention unit placed on the second side surface and that prevents an access of a person to the frame.

9. A loader device, comprising:
a frame;
a first opening formed in a first side surface of the frame;
a second opening formed in a second side surface of the frame that is opposite to the first side surface;
a cavity that connects the first opening and the second opening and penetrates the frame;
a transport unit placed in the cavity and that transfers a substrate carrier between the first opening and the second opening;
a first sensor placed on the first side surface and that senses a presence or absence of a first substrate carrier adjacent to the first opening;
a second sensor placed on the first side surface and that senses light emitted onto the first side surface;
a third sensor placed on the second side surface and that senses access of a person in a sensing region around the frame;
a fourth sensor placed on the second side surface and that measures a displacement of a transport robot with respect to the second opening;
an access prevention unit placed on the second side surface and that prevents access to the frame; and
a controller that receives first to fourth sensor signals from the first to fourth sensors and controls the transport unit,
wherein the transport unit includes
a traveling shaft that extends parallel to an upper surface of the frame and is placed on an inner upper surface of the cavity,
an elevating shaft connected to the traveling shaft and that extends in a direction perpendicular to the upper surface,
a rotary shaft connected to the elevating shaft and that rotates in a plane parallel to the upper surface between the first opening and the second opening,
a fork shaft fixed to the rotary shaft and that linearly moves parallel to the upper surface,
a hand unit connected to the fork shaft and that grips the substrate carrier,
a fifth sensor placed in the hand unit and that measures a position of the hand unit with respect to the transport robot, and
a sixth sensor placed on a side portion of the rotary shaft and that senses a presence or absence of a second substrate carrier on the transport robot adjacent to the second opening,
the controller discriminates a first mode and a second mode based on a second sensor signal received from the second sensor,
in response to the first sensor signal that indicates the presence of the first substrate carrier adjacent to the first opening,
the controller controls the transport unit to not transfer the second substrate carrier from the second opening to the first opening in the first mode,
the controller controls the transport unit to pick up the first substrate carrier from the first opening in the second mode, the controller interrupts the operation of the transport unit in response to the third sensor signal received from the third sensor that indicates access of the person in the sensing region, and the controller adjusts a position of the hand unit of the transport unit, in response to the fourth sensor signal received from the fourth sensor that includes a displacement value of the transport robot with respect to the second opening.

\* \* \* \* \*